United States Patent
Matsueda

(10) Patent No.: US 8,294,637 B2
(45) Date of Patent: Oct. 23, 2012

(54) ACTIVE MATRIX SUBSTRATE, ELECTRO-OPTICAL DEVICE, AND ELECTRONIC DEVICE

(75) Inventor: Yojiro Matsueda, Chino (JP)

(73) Assignee: Seiko Epson Corporation, Tokyo (JP)

( * ) Notice: Subject to any disclaimer, the term of this patent is extended or adjusted under 35 U.S.C. 154(b) by 1027 days.

(21) Appl. No.: 11/483,087

(22) Filed: Jul. 10, 2006

(65) Prior Publication Data

US 2006/0267887 A1 Nov. 30, 2006

Related U.S. Application Data

(62) Division of application No. 10/299,861, filed on Nov. 20, 2002, now Pat. No. 7,483,001.

(30) Foreign Application Priority Data

| Nov. 21, 2001 | (JP) | 2001-356007 |
| Dec. 5, 2001 | (JP) | 2001-371403 |
| Dec. 5, 2001 | (JP) | 2001-371410 |

(51) Int. Cl.
  *G09G 3/30* (2006.01)
(52) U.S. Cl. .......... 345/76; 345/45; 315/169.3
(58) Field of Classification Search .......... 345/30–45, 345/76; 315/169.3
  See application file for complete search history.

(56) References Cited

U.S. PATENT DOCUMENTS

| 5,144,288 A | 9/1992 | Hamada et al. |
| 5,684,365 A * | 11/1997 | Tang et al. ............... 315/169.3 |
| RE35,827 E | 6/1998 | Gualandris et al. |
| 5,815,226 A | 9/1998 | Yamazaki et al. |
| 5,867,233 A | 2/1999 | Tanaka |
| 6,094,248 A * | 7/2000 | Hayashi ................. 349/139 |
| 6,100,119 A | 8/2000 | Jang et al. |
| 6,118,506 A | 9/2000 | Yamazaki et al. |
| 6,153,893 A | 11/2000 | Inoue et al. |
| 6,194,837 B1 | 2/2001 | Ozawa |

(Continued)

FOREIGN PATENT DOCUMENTS

CN 1242924 A 1/2000

(Continued)

OTHER PUBLICATIONS

Shang-Li Chen et al.; "Current Programmed Pixel Structures for OLED"; Electronics Research & Service Organization; Hsinchu, Taiwan; Oct. 2001, pp. 399-402.

(Continued)

*Primary Examiner* — Amare Mengistu
*Assistant Examiner* — Dmitriy Bolotin
(74) *Attorney, Agent, or Firm* — Oliff & Berridge, PLC

(57) ABSTRACT

An active matrix substrate is provided which does not cause reductions in the brightness of electroluminescence elements, and which comprises appropriate peripheral circuitry occupying a small area. The active matrix substrate comprises peripheral circuits to supply current to EL elements provided for each pixel, and corresponding to EL elements, and further comprises a holding element (C) which holds a control voltage, a first active element (T1) connected to the holding element (C) and which supplies current to a light-emitting portion (OLED) based on a control voltage, and a second active element (T2) connected to the holding element (C) and which controls the charging and discharging of the holding element. In particular, the second active element (T2) is configured as a multiple-control-terminal type active element. As a result, there are no fluctuations in the programmed current.

4 Claims, 15 Drawing Sheets

U.S. PATENT DOCUMENTS

| | | | |
|---|---|---|---|
| 6,225,750 B1 | 5/2001 | Kimura | |
| 6,229,506 B1 | 5/2001 | Dawson et al. | |
| 6,271,543 B1 | 8/2001 | Ohtani et al. | |
| 6,307,528 B1* | 10/2001 | Yap | 345/45 |
| 6,373,454 B1 | 4/2002 | Knapp et al. | |
| 6,468,839 B2 | 10/2002 | Inoue et al. | |
| 6,501,448 B1 | 12/2002 | Komiya et al. | |
| 6,509,688 B1* | 1/2003 | Bae et al. | 313/504 |
| 6,515,428 B1* | 2/2003 | Yeh et al. | 315/169.3 |
| 6,548,960 B2 | 4/2003 | Inukai | |
| 6,657,230 B1* | 12/2003 | Murade | 257/72 |
| 6,661,180 B2 | 12/2003 | Koyama | |
| 6,690,033 B2 | 2/2004 | Yamazaki et al. | |
| 6,756,740 B2 | 6/2004 | Inukai | |
| 6,781,155 B1 | 8/2004 | Yamada | |
| 6,794,675 B1 | 9/2004 | Suzuki et al. | |
| 6,859,193 B1 | 2/2005 | Yumoto | |
| 6,882,102 B2 | 4/2005 | Yamazaki | |
| 6,914,390 B2 | 7/2005 | Koyama | |
| 6,952,244 B2 | 10/2005 | Cairns et al. | |
| 6,958,740 B1 | 10/2005 | Nishikawa | |
| 7,106,006 B2 | 9/2006 | Koyama | |
| 7,233,342 B1 | 6/2007 | Yamazaki et al. | |
| 7,277,070 B2 | 10/2007 | Koyama | |
| 7,368,868 B2 | 5/2008 | Sakamoto | |
| 7,483,001 B2* | 1/2009 | Matsueda | 345/76 |
| 2001/0014493 A1 | 8/2001 | Inoue et al. | |
| 2001/0017517 A1* | 8/2001 | Yamazaki | 313/504 |
| 2001/0019327 A1 | 9/2001 | Kim et al. | |
| 2001/0026125 A1* | 10/2001 | Yamazaki et al. | 313/505 |
| 2001/0026835 A1 | 10/2001 | Tanaka | |
| 2001/0040565 A1 | 11/2001 | Koyama | |
| 2001/0043173 A1 | 11/2001 | Troutman | |
| 2001/0049881 A1* | 12/2001 | Look et al. | 33/645 |
| 2002/0000614 A1 | 1/2002 | Chen et al. | |
| 2002/0008822 A1 | 1/2002 | Maeda | |
| 2002/0021266 A1 | 2/2002 | Koyama et al. | |
| 2002/0030770 A1 | 3/2002 | Tsutsui et al. | |
| 2002/0044111 A1 | 4/2002 | Yamazaki et al. | |
| 2002/0067323 A1 | 6/2002 | Bird et al. | |
| 2002/0070385 A1 | 6/2002 | Yamagata | |
| 2002/0154253 A1 | 10/2002 | Cairns et al. | |
| 2002/0186188 A1 | 12/2002 | Cok | |
| 2004/0012548 A1 | 1/2004 | Anzai | |
| 2004/0135181 A1 | 7/2004 | Yamazaki et al. | |
| 2004/0207615 A1 | 10/2004 | Yumoto | |
| 2005/0231122 A1* | 10/2005 | Osame et al. | 315/169.1 |
| 2007/0007527 A1 | 1/2007 | Koyama | |

FOREIGN PATENT DOCUMENTS

| | | |
|---|---|---|
| CN | 1291786 A | 4/2001 |
| EP | 0158366 A2 | 10/1985 |
| EP | 1 003 223 A2 | 5/2000 |
| EP | 1024472 A2 | 8/2000 |
| EP | 1 093 156 A2 | 4/2001 |
| EP | 1 093 166 A2 | 4/2001 |
| EP | 1 096 579 A2 | 5/2001 |
| EP | 1 128 436 A1 | 8/2001 |
| EP | 1594347 A1 | 11/2005 |
| JP | A 60-128486 | 7/1985 |
| JP | A 1-101519 | 4/1989 |
| JP | A 2-170135 | 6/1990 |
| JP | A-10-12377 | 1/1998 |
| JP | A 11-65487 | 3/1999 |
| JP | A-11-074073 | 3/1999 |
| JP | A 2000-137241 | 5/2000 |
| JP | A 2000-214800 | 8/2000 |
| JP | A 2000-267131 | 9/2000 |
| JP | A 2000-284722 | 10/2000 |
| JP | A 2000-284727 | 10/2000 |
| JP | A-2000-310980 | 11/2000 |
| JP | A 2001-13893 | 1/2001 |
| JP | A-2001-85162 | 3/2001 |
| JP | A-2001-185354 | 7/2001 |
| JP | A-2001-242827 | 9/2001 |
| JP | A-2001-318628 | 11/2001 |
| JP | A-2001-319789 | 11/2001 |
| JP | A-2002-351357 | 12/2002 |
| JP | A 2003-323133 | 11/2003 |
| KR | 1994-0009134 | 10/1994 |
| KR | 2001-0014528 A | 2/2001 |
| WO | WO 98/36407 | 8/1998 |
| WO | WO 01/06484 A1 | 1/2001 |
| WO | WO 01/18774 A1 | 3/2001 |
| WO | WO 01/75853 | 10/2001 |

OTHER PUBLICATIONS

Eiji Takeda et al.; "An As-P($n^+$-$n^-$) Double Diffused Drain MOSFET for VLSI's"; IEEE Transactions on Electron Devices, IEEE Service Center; Piscataway, NJ; vol. 30; No. 6; Jun. 1983; pp. 652-657.
Office Action issued Nov. 12, 2010 in U.S. Appl. No. 11/483,109.
Office Action issued Feb. 8, 2011 in U.S. Appl. No. 12/917,885.
Jun. 21, 2011 Office Action issued in U.S. Appl. No. 12/917,885.
Nov. 2, 2011 Office Action issued in U.S. Appl. No. 12/917,885.
Mar. 28, 2012 Search Report issued in European Patent Application No. 10191880.3.
Lungu G. Et al.: "Thin Film Active Matrix Organic Electroluminescent Display Development", University/Government/Industry Microelectronics Symposium, 1997 IEEE; pp. 165-168.
Jun. 28, 2012 Office Action issued in U.S. Appl. No. 12/917,885.

* cited by examiner

ACTIVE MATRIX SUBSTRATE, ELECTRO-OPTICAL DEVICE, AND ELECTRONIC DEVICE

This is a Divisional of application Ser. No. 10/299,861 filed Nov. 20, 2002. The entire disclosure of the prior application is hereby incorporated by reference herein in its entirety.

BACKGROUND OF THE INVENTION

1. Field of the Invention

This invention relates to an active matrix substrate suitable for electro-optical devices, an electro-optical device, and electronic device.

2. Description of the Related Art

The active matrix driving method is one method of driving electro-optical devices comprising liquid crystal elements, organic electroluminescence (EL) elements, electrophoretic elements, electronic emission elements, and similar. In an electro-optical device driven by the active matrix driving method, a plurality of pixels are arranged in a matrix on the display panel. Each of the plurality of pixels comprises a pixel circuit, in turn comprising an electro-optical element and a driving transistor which supplies driving power to the electro-optical element. Each of the plurality of pixel circuits is arranged to correspond to the intersection of a data line and a scan line (see, for example, patent reference 1: Internationally disclosed pamphlet no. WO98/36407).

In order to precisely control brightness in an electro-optical device, the amount of power supplied to electro-optical elements must be precisely controlled. In particular, because organic EL elements are current-driving type electro-optical elements, the brightness is directly affected by the current. Hence there is a need to precisely supply the desired current to organic EL elements; and in addition to optimizing the driving circuit and driving method, the pixel layout must also be optimized. Problems encountered in actual pixel layouts include, for example, contact between pixel electrodes and peripheral circuitry, stability of holding capacitances, and transistor turn-off currents.

The present invention was devised in light of the above circumstances, and has as an object the provision of an active matrix substrate, electro-optical device, and electronic device comprising an optimal pixel layout for the stable driving of electro-optical elements.

SUMMARY OF THE INVENTION

In order to resolve the above problems, a first active matrix substrate of this invention is an active matrix substrate comprising peripheral circuitry to supply a current to electro-optical elements provided in each pixel according to the electro-optical element; each peripheral circuit comprises a holding element to hold a control voltage, a first active element, connected to the holding element, to supply a current to the electro-optical element based on the control voltage, and a second active element, connected to the holding element, to control the charging and discharging of the holding element; and the above second active element has a structure which prevents leakage currents during shutoff.

Here "electro-optical element" refers to general elements which emit light, or change a status of light in response to external light, due to electrical action, and comprises both elements which themselves emit light, and elements which control the transmission of external light. For example, electro-optical elements include liquid crystal elements, electrophoretic elements, EL elements, and electron emission elements which emit light by causing electrons generated through application of an electric field to strike an emission plate.

"Peripheral circuits" refers to the aggregation of circuit elements which drive each pixel in an active-matrix type electro-optical device, and comprises, for example, TFTs (thin film transistors) or similar.

"Active matrix substrate" refers to general substrates on which is mounted peripheral circuitry, regardless of whether electro-optical elements are formed or not.

There is no particular restriction on "active elements", which may include, for example, TFTs and other transistors and diodes, or similar.

Here "holding element" refers to, for example, capacitors, memory, and other elements which hold electrical signals.

Normally, when an active element is in the non-conducting state, whereas ideally there should be no current flowing, a current, albeit slight, may flow; an active element having a "structure to prevent leakage currents during shutoff" refers to an active element configured with the object of preventing the occurrence of such a current (leakage current).

An example of such an element is a multi-gate type active element. A multi-gate type active element is an active element which functions as a single element, but strictly speaking comprises a plurality of active elements connected in series, configured to function similarly to a device with control terminals connected together.

In configuring a multi-gate type active element, the semiconductor layer may be in a curved shape, as in an embodiment described below, or the gate shape may be curved.

The second active element may be a transistor with a structure selected from the group consisting of an LDD structure, GDD structure, or DDD structure. Here "LDD" is an abbreviation of "Lightly Doped Drain"; "GDD" is an abbreviation of "Graded Diffused Drain"; and "DDD" is an abbreviation of "Double Diffused Drain". In a transistor having these structures, in order to limit the adverse effects of hot electrons and similar during fine MOSFET fabrication, the maximum electric field near the drain is weakened. For example, in such transistors the drain region of the transistor is lightly doped with impurities to relax the electric field in regions where impurity diffusion is performed and between silicon substrates; for example, n-type regions may be formed using self-alignment.

In such transistors, because the source-drain resistance while the transistor is turned off is extremely high and leakage currents are reduced, electric charge accumulated in the holding element is not released, and the electric potential applied to a control terminal can be maintained at a constant level.

A second active matrix substrate of this invention is an active matrix substrate comprising a plurality of unit circuits, arranged to correspond to the intersections of a plurality of data lines and a plurality of scan lines. Each of the above plurality of unit circuits comprises a first transistor, which comprises a first control terminal, first terminal, and second terminal; a holding element, connected to the above first control terminal, comprising a first electrode and a second electrode; and a second transistor, comprising a third terminal, a fourth terminal, and a second control terminal, wherein the above third terminal and the above fourth terminal are respectively connected to the above first terminal and to the above first electrode; and the above second transistor has a multi-gate structure.

In the above active matrix substrate, in place of a multi-gate structure, the above second transistor may be a transistor with a structure selected from an LDD structure, GDD structure, or DDD structure.

By adopting a multi-gate structure and an LDD structure, GDD structure, or DDD structure, the leakage current when the second transistor is in the turned-off state can be reduced, so that the electric charge accumulated in the holding element can be maintained for a long period of time.

In the above active matrix substrate, it is preferable that the above first transistor and the above second transistor have different conduction types. In this case, it is preferable that the semiconductor film constituting the above first transistor and the semiconductor film constituting the above second transistor be separated.

For example, it is preferable that the above first transistor by p-type, and that the above second transistor be n-type.

The above active matrix substrate may further comprise a third transistor, comprising a fifth terminal, a sixth terminal, and a third control terminal, with the above third control terminal connected to one scan line among the above plurality of scan lines, and the above fifth terminal connected to one data line among the above plurality of data lines.

The above sixth terminal may be connected to the above third terminal and to the above first terminal.

In the above active matrix substrate, the above active matrix substrate may have a stacked-layer structure comprising a plurality of layers; the above plurality of layers may comprise a semiconductor layer, in which is formed a semiconductor film constituting the above first and second transistors, and a gate metal layer, in which are formed the above second control terminals; and in the above gate metal layer there may be formed at least one portion of at least one scan line among the above plurality of scan lines.

By this means, the above second control terminal and at least one portion of the scan line can be formed in the same process, so that manufacturing processes can be shortened.

In the above active matrix substrate, the above active matrix substrate may have a stacked-layer structure comprising a plurality of layers; the above plurality of layers may comprise a semiconductor layer, in which is formed a semiconductor film constituting the above first and second transistors, and a gate metal layer, in which are formed the above second control terminals; and in the above gate metal layer there may be formed at least one portion of at least one data line among the above plurality of data lines.

By this means, the above second control terminal and at least one portion of the data line can be formed in the same process, so that manufacturing processes can be shortened.

In the above active matrix substrate, the above active matrix substrate may have a stacked-layer structure comprising a plurality of layers; the above plurality of layers may comprise a semiconductor layer, in which is formed a semiconductor film constituting the above first and second transistors, a gate metal layer, in which are formed the above second control terminals, and a source metal layer, in which is formed a source electrode or drain electrode connected to the source or to the drain of the above second transistor; and at least one portion of at least one data line among the above plurality of data lines may be formed in the layer closer to the above semiconductor layer among the above source metal layer and the above gate metal layer.

By this means, when an electro-optical device is formed in which electro-optical elements are arranged above the active matrix substrate, at least one portion of a data line can be separated from the electrodes of electro-optical elements, so that operation delays due to stray capacitances occurring between electrodes and data lines can be reduced.

A third active matrix substrate of this invention comprises unit circuits, comprising transistors, as well as data lines and scan lines, and has a stacked-layer structure comprising a plurality of layers; the above plurality of layers comprises a semiconductor layer, in which is formed a semiconductor film constituting transistors, and a gate metal layer, in which are formed the gate terminals of the above transistors; and at lease one portion of either the above scan lines, or the above data lines, or both, is formed in the above gate metal layer.

By this means, transistor gate terminals and at least one portion of the scan lines or data lines can be manufactured by the same process, so that manufacturing processes can be shortened.

A fourth active matrix substrate of this invention comprises unit circuits, comprising transistors, as well as data lines and scan lines, and has a stacked-layer structure comprising a plurality of layers; the above plurality of layers comprises a semiconductor layer, in which is formed a semiconductor film constituting transistors, a gate metal layer, in which are formed the gate terminals of the above transistors, and a source metal layer in which are formed the source electrodes or drain electrodes which are connected to the sources or drains of the above transistors; and at lease one portion of either the above scan lines, or the above data lines, or both, is formed in the layer, among the above gate metal layer and the above source metal layer, which is closer to the above semiconductor layer.

In the above active matrix substrate, when an electro-optical device is formed in which electro-optical elements are arranged above the active matrix substrate, at least one portion of data lines or scan lines can be separated from the electrodes of electro-optical elements, so that delays in signal supply due to stray capacitances occurring between electrodes and data lines or scan lines can be suppressed.

In the above active matrix substrate, it is preferable that a unit circuit comprise a first transistor, comprising a first control terminal, a first terminal, and a second terminal; a holding element, connected to the above first control terminal, and comprising a first electrode and a second electrode; and a second transistor, comprising a third terminal, a fourth terminal, and a second control terminal, wherein the above third terminal and the above fourth terminal are respectively connected to the above first terminal and to the above first electrode; and that the unit circuit have at least a structure selected from an LDD structure, GDD structure, DDD structure, or multi-gate structure.

The LDD structure, GDD structure, DDD structure, and multi-gate structure are appropriate structures for suppressing current leaks, and so by employing such a configuration, the electric charge accumulated in the holding element can be maintained for long periods of time.

A first electro-optical device of this invention comprises the above active matrix substrate, and electro-optical elements.

A second electro-optical device of this invention comprises peripheral circuits to supply current to electro-optical elements provided for each pixel, corresponding to the above electro-optical elements; each of the above peripheral circuits comprises a light emission-controlling active element to supply current to the above electro-optical element during the light emission period, a holding element to hold a control voltage, a first active element the gate terminal of which is connected to the above holding element and which supplies a current based on the above control voltage applied to the gate terminal to the above electro-optical element, via the above light emission-controlling active element, a current-controlling active element which passes a constant current (or a data current) via the above first active element during the selection period, and a second active element connected between the above current-controlling active element and the above holding element, which charges the above holding element during the above selection period and which stores the above control voltage; and the above second active element comprises a structure to prevent leakage currents during shutoff.

As the above structure to prevent leakage currents, similarly to the case of the above active matrix substrates, for example, an LDD structure, GDD structure, DDD structure, or multi-gate structure can be adopted.

In the above electro-optical device, as the above first active element and the above second active element, it is preferable that, for example, a transistor be used. In this case, it is preferable that the transistors have different conduction types. For example, it is preferable that the above first active element be p-type, and that the above second active element be n-type.

Corresponding to this, a configuration may be adopted comprising a first driver circuit which supplies negative-logic data signals to the first active element, and a second driver circuit which supplies positive-logic scan signals to the second active element.

In the above electro-optical device, a configuration may be adopted comprising data lines which supply data signals to first active elements, and scan lines, intersecting the data lines, which supply scan signals to second active elements.

In the above electro-optical device, it is preferable that either the data lines or the scan lines be wired by means of the metal layer, among the source metal layer and the gate metal layer which comprise the first active elements and second active elements, which is separated from the common electrodes of the electro-optical elements. This is because if the metal layer which is more distant from the common electrodes is used, the stray capacitance arising between the signal lines and the common electrodes can be reduced.

Specifically, the scan lines may for example be wired using the gate metal layer which forms the gate terminals of the second active elements.

In the above electro-optical device, it is preferable that, among the plurality of active elements, the plurality of active elements having the same polarity be formed continuously and in planar fashion in the same semiconductor layer. This is because, if the semiconductor layer is thus made continuous, the area used for wiring can be reduced, and the aperture ratio can be increased.

At this time, connection points between a plurality of active elements having the same polarity comprise common contact holes, and wiring is performed from contact holes to active elements having a polarity differing from these active elements. This is because when the polarity is different, normal wiring must be performed. By this means, contact holes can be made common, and the area of occupation of connection portions in the entire area of the driving circuit can be reduced.

In one embodiment described below, a plurality of active elements having the same polarity comprises second active elements, light emission-controlling active elements, and current-controlling active elements; however, the present invention is of course not limited thereto.

As the gate terminals of the above second active elements and the above current-controlling active elements, common scan lines may be used; in this case, with respect to common gate terminal connections, by using scan lines without modification the wiring area can be reduced and the aperture ratio can be raised.

However, if the above second active elements and the above current-controlling active elements are not driven with the same timing, then of course different signal lines can be used as the respective gate terminals.

A third electro-optical device of this invention comprises electro-optical elements, and peripheral circuitry driving the above electro-optical elements; the above electro-optical elements are formed such that the boundaries of the electro-optical elements have at least a prescribed curvature, and at least a portion of the peripheral circuits is formed in the region surrounded by the boundaries having at least the prescribed curvature and by polygonal boundaries circumscribing the electro-optical elements.

A shape having a "prescribed curvature" is particularly effective when electro-optical elements are formed using liquid materials; in this case, it is desirable that the prescribed curvature be set according to the viscosity and surface tension of the liquid material, and according to the material of the layer below the electro-optical elements. However, even in cases where the electro-optical elements are formed by evaporation deposition or other means without using liquid materials, there is the advantageous result that short-circuits are prevented.

It is preferable that a plurality of boundary portions having this prescribed curvature be formed. It is also preferable that the plurality of boundary portions thus formed be arranged essentially symmetrically with respect to a center line passing through the geometric center of the electro-optical element.

For example, a portion of the peripheral circuit formed in this region is a contact hole comprised by wiring of the peripheral circuit. It is preferable that this contact hole be of polygonal shape compatible with the shape of the region. A contact hole comprised by the wiring of the peripheral circuit is, for example, a contact hole which supplies current to at least one of the electrodes of the electro-optical element. It is preferable that there be a plurality of contact holes, arranged essentially symmetrically with respect to a center line passing through the geometric center point of the above electro-optical element.

When using a liquid material to form electro-optical elements, by providing an affinity-controlling layer which adjusts the affinity for the liquid material near the boundaries of electro-optical elements, the film thickness of the functional layer constituting the electro-optical elements can be controlled, and flatness can be improved. Also, by making the affinity for the liquid material of, at least, the walls of the bank layer different from that of the above affinity-controlling layer, the effectiveness may be further increased. For example, by making the affinity for the liquid material of the walls of the bank layer lower than that of the affinity-controlling layer, the film formed by the liquid material no longer adheres to the walls of the bank layer, and the flatness of the film formed by the liquid material is further improved.

This affinity-controlling layer may be formed so as to have a staircase-shape on the inside of the electro-optical elements with respect to the walls formed by the bank layer.

Here a "bank" is a partition member to partition pixel regions. A bank is also effective for securing a distance from cathodes or common electrodes and data lines, scan lines, or other wiring which supplies signals. By securing a sufficient distance, the parasitic capacitance is reduced, and delays when supplying signals can be suppressed.

In general, data signals are greatly affected by stray capacitances of scan signals, which can cause operation delays, and so a sufficient distance must be secured between data signals and common electrodes or cathodes.

It is preferable that, in boundary portions having a prescribed curvature, at least one of the electrodes constituting the electro-optical element be patterned according to the shape of the boundary portion. This is because, by patterning electrodes in a manner compatible with the curvature, at least a portion of the peripheral circuit can be arranged more easily. For example, at least a portion of the peripheral circuit is a contact region to enable connection between the peripheral circuit and the above electrode.

A fourth electro-optical device of this invention comprises a light-emitting portion, and a peripheral circuit which controls the current supplied to the above light-emitting portion via a pixel electrode; the area of the above light-emitting portion is smaller than the area of the above pixel electrode, and the shape of the above light-emitting portion is different from the shape of the above pixel electrode.

A fifth electro-optical device of this invention comprises a light-emitting portion, and a peripheral circuit which controls the current supplied to the above light-emitting portion via a pixel electrode; the area of the above light-emitting portion is smaller than the area of the above pixel electrode; the shape of the above light-emitting portion is a shape having a curvature, and the shape of the above pixel electrode is polygonal.

A sixth electro-optical device of this invention comprises a light-emitting portion, and a peripheral circuit which controls the current supplied to the above light-emitting portion via a pixel electrode; the area of the above light-emitting portion is smaller than the area of the above pixel electrode; the above light-emitting portion has a polygonal shape having n vertices (where n is an integer equal to 4 or greater); the above pixel electrode has a polygonal shape having m vertices (where m is an integer equal to 3 or greater); and the relation n>m obtains.

In the above electro-optical device, the light-emitting portion has a shape having a curvature, or has a polygonal shape with four or more vertices, so that short-circuits in the edge portions of light-emitting portion can be prevented. And when forming light-emitting portions using a liquid material, the liquid material can be made to extend thoroughly to the edge portions of light-emitting portions, so that a uniform film can be formed.

In the above electro-optical device, it is preferable that the entire region of the above light-emitting portion be formed on the above pixel electrode, and that a contact region for connection to the above peripheral circuit and to the above pixel electrode be provided in the portion of the above pixel electrode where the above light-emitting portion is not formed.

A seventh electro-optical device of this invention comprises an electro-optical element, a holding capacitance which regulates the current supplied to the above electro-optical element, and an active element which supplies a current according to the voltage recorded in the holding capacitance; a first electrode constituting the holding capacitance is formed by patterning a portion of a metal layer which forms a power supply line supplying current to the electro-optical element.

An eighth electro-optical device of this invention is configured to enable the supply of current to an electro-optical element by an active element according to the voltage recorded in a holding capacitance, and comprises a first metal layer connected to a power supply, and a second metal layer patterned to comprise a portion of a control terminal of an active element; a first electrode constituting the holding capacitance is formed by patterning a portion of the first metal layer.

Here "layer" comprises, in addition to a metal layer, a layer which affects formation of the holding capacitance, such as for example a semiconductor layer.

A second electrode constituting the holding capacitance is formed by patterning a portion of the metal layer which forms the control terminal of the active element.

In the above electro-optical device, the above first electrode may be a portion of the power supply line, and a portion of the metal layer forming the control terminal of the active element in a portion of the power supply line may be overlapped in patterning to form the above second electrode. By means of this configuration, there is no need in particular to provide wiring to connect the holding capacitance and the active element, so that the aperture ratio can be increased.

It is preferable that a semiconductor layer be comprised, overlapping electrodes constituting the holding capacitance and formed in the shape of the electrodes. This semiconductor layer may for example have impurities introduced. The semiconductor layer may be doped with impurities to metallize or to lower the resistance.

It is preferable that the holding capacitance be formed in a region other than the region in which the electro-optical element and active element are formed, so that the aperture ratio is raised. For example, each of the layers comprising the electrodes of the holding capacitance may be formed on a polygon, such as for example a pentagon, corresponding to the shape of the region other than the region in which are formed the electro-optical element and active element.

In the above electro-optical device, it is preferable that, of the layers comprising the holding capacitance electrodes, the region occupied by the layer positioned on the lower side be formed to be greater than the region occupied by the layer positioned on the upper side.

In the above electro-optical device, the region occupied by the layer positioned on the lower side is formed by patterning into a shape such that, even if the greatest possible position shift that can occur during formation of the layer positioned on the upper side occurs, the region of the layer positioned on the upper side is contained within the region of the layer positioned on the lower side.

In the above electro-optical device, it is preferable that a bank layer be further comprised in order to isolate neighboring electro-optical elements, and that the holding capacitance be formed under the bank layer.

In addition, an affinity-controlling layer may be further comprised, within the bank layer or below the bank layer, in order to control the affinity of the liquid material during formation of electro-optical elements.

The overlap region in which is formed the holding capacitance may be provided in a region in which at least one among the first metal layer and the second metal layer is formed in a power supply wiring pattern.

It is further preferable that the wiring pattern formed by the second metal layer be positioned at a prescribed distance or greater from at least one among the two electrodes connected to the electro-optical element. By means of this configuration, unwanted capacitance can be reduced.

A fifth active matrix of this invention is an active matrix substrate comprising pixel electrodes and paths positioned corresponding to the intersections of data lines and scan lines; the above pixel electrodes are connected to a power supply line via at least one transistor; a holding element connected to the gate of the above one or more transistors is provided; and a first electrode constituting the above holding element is connected to the above power supply line.

A sixth active matrix substrate of this invention is an active matrix substrate comprising pixel electrodes and paths positioned corresponding to the intersections of data lines and scan lines; the above pixel electrodes are connected to a power supply line via at least one transistor; a holding element connected to the gate of the above one or more transistors is provided; and a first electrode constituting the above holding element is a portion of the above power supply line.

In the above active matrix substrate, a second electrode constituting the above holding element is the gate of the above one or more transistors.

A seventh active matrix substrate of this invention is an active matrix substrate comprising unit circuits each comprising a transistor, corresponding to the intersections of scan lines and data lines; a semiconductor film constituting the above transistors is formed in a semiconductor layer; at the intersections of the above scan lines and the above data lines, either the above scan line or the above data line is formed in a first conducting layer; and the portions of the above scan line and the above data line other than at the above intersection are formed in a second conducting layer. In this active matrix substrate, it is preferable that the above second conducting layer be positioned between the above first conducting layer and the above semiconductor layer.

By combining the above active matrix substrate with electro-optical elements, an electro-optical device can be configured.

A ninth electro-optical device of this invention is an electro-optical device comprising electro-optical elements corresponding to the intersections of scan lines and data lines; either the above scan lines or the above data lines are formed in a first conducting layer at the intersections of the above scan lines and the above data lines, together with a pair of electrodes which supply power to the above electro-optical element; the portions of the above scan lines and the above data lines other than in the above intersections are formed in a second conducting layer; and the above second conducting layer is positioned at a greater distance than the above first conducting layer from one of the above pair of electrodes.

Here, the above electro-optical elements may be electroluminescence (EL) elements. "Electroluminescence elements" refer in general to elements, whether employing an organic or an inorganic (such as Zn:S) light-emitting material, which utilize electroluminescence phenomena in which the application of an electric field causes holes injected from an anode and electrons injected from a cathode to recombine, so that the recombination energy causes the light-emitting material to emit light. As the layer structure enclosed between the electroluminescence element, in addition to a light-emitting layer comprising light-emitting material, a hole transport layer or an electron transport layer, or both, may also be comprised. Specifically, as layer structures, in addition to a cathode/light-emitting layer/anode structure, a cathode/light-emitting layer/hole transport layer/anode, cathode/electron transport layer/light-emitting layer/anode, cathode/electron transport layer/light-emitting layer/hole transport layer/anode, or similar may be adopted.

The above active matrix substrates may also be employed in electronic device. Here there is no particular restriction on "electronic device", which includes a device comprising a display device comprising an active matrix substrate, such as for example portable telephones, video cameras, personal computers, head-mounted displays, rear- or front-projectors, and also fax machines with display functions, the viewfinder of digital cameras, portable TV sets, DSP devices, PDAs, electronic organizers, and similar.

BRIEF DESCRIPTION OF THE DRAWINGS

FIG. 3 shows plane views of a pixel region in embodiment 1.

FIG. 4 shows examples of modification of the boundary shape of the light-emitting portion.

FIG. 9 shows cross-sectional views of a pixel region in embodiment 2.

FIG. 10A is a cross-section along A-A in FIG. 10, and FIG. 10B is a cross-section along B-B in FIG. 10;

FIG. 13 shows cross-sectional views of a pixel region in embodiment 4.

DESCRIPTION OF THE PREFERRED EMBODIMENTS

Figure 1:
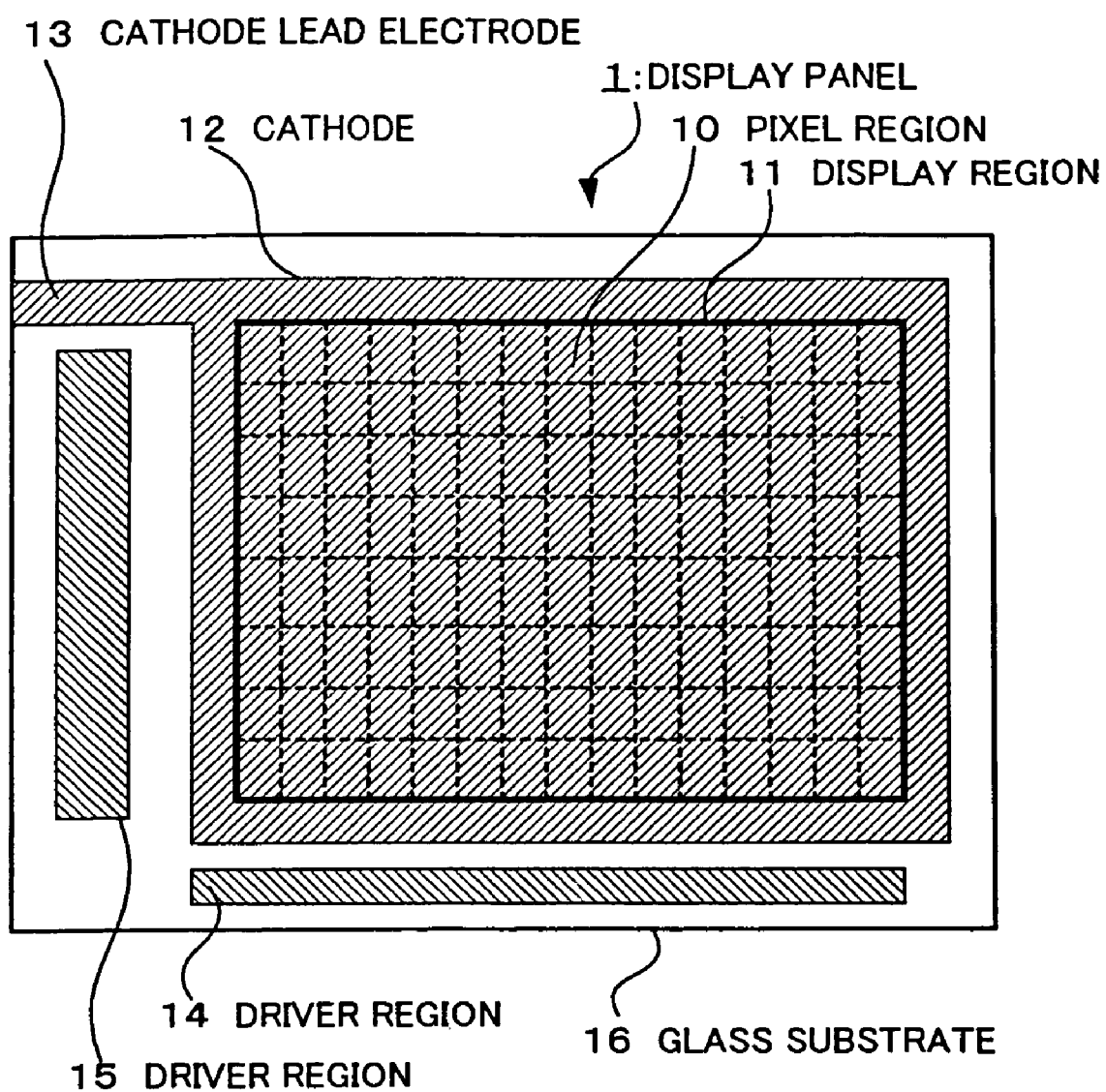
FIG. 1 is an overall drawing of a display panel of this embodiment.

Next, preferred embodiments of the invention are explained, referring to the drawings as examples. The following embodiments are no more than examples of embodiments of this invention, and do not limit the scope of application.

Embodiment 1

This embodiment of the invention relates to a display panel which is an electro-optical device employing EL elements as electro-optical elements. FIG. 1 is an overall drawing of a display panel comprising an active matrix panel, comprising EL elements.

As shown in FIG. 1, the display panel 1 is configured by positioning a display region 11 and driver regions 14 and 15 on a glass substrate 16. A cathode 12 is formed over the entirety of the display region 11, and is connected to the cathode lead electrode 13. Pixel regions 10 are arranged in a matrix in the display region 11. In the case of a color display, the pixel regions 10 are configured to enable emission of primary colors (for example, the three primary colors red, blue, green) taken as necessary for color display; a combination of pixel regions emitting light of each primary color becomes one pixel element. For example, the driver region 15 positioned in the column direction of the display region 11 outputs a write control line Vsel and a light emission control line Vgp; and the driver region 14 positioned in the row direction of the display region 11 outputs, in addition to the power supply line Vdd, data current signals to the data line Idata. By controlling the light-emission state in each pixel region 10 by means of driver circuits, not shown, formed in the driver regions 14 and 15, an arbitrary image can be displayed in the display region 11.

Figure 2:
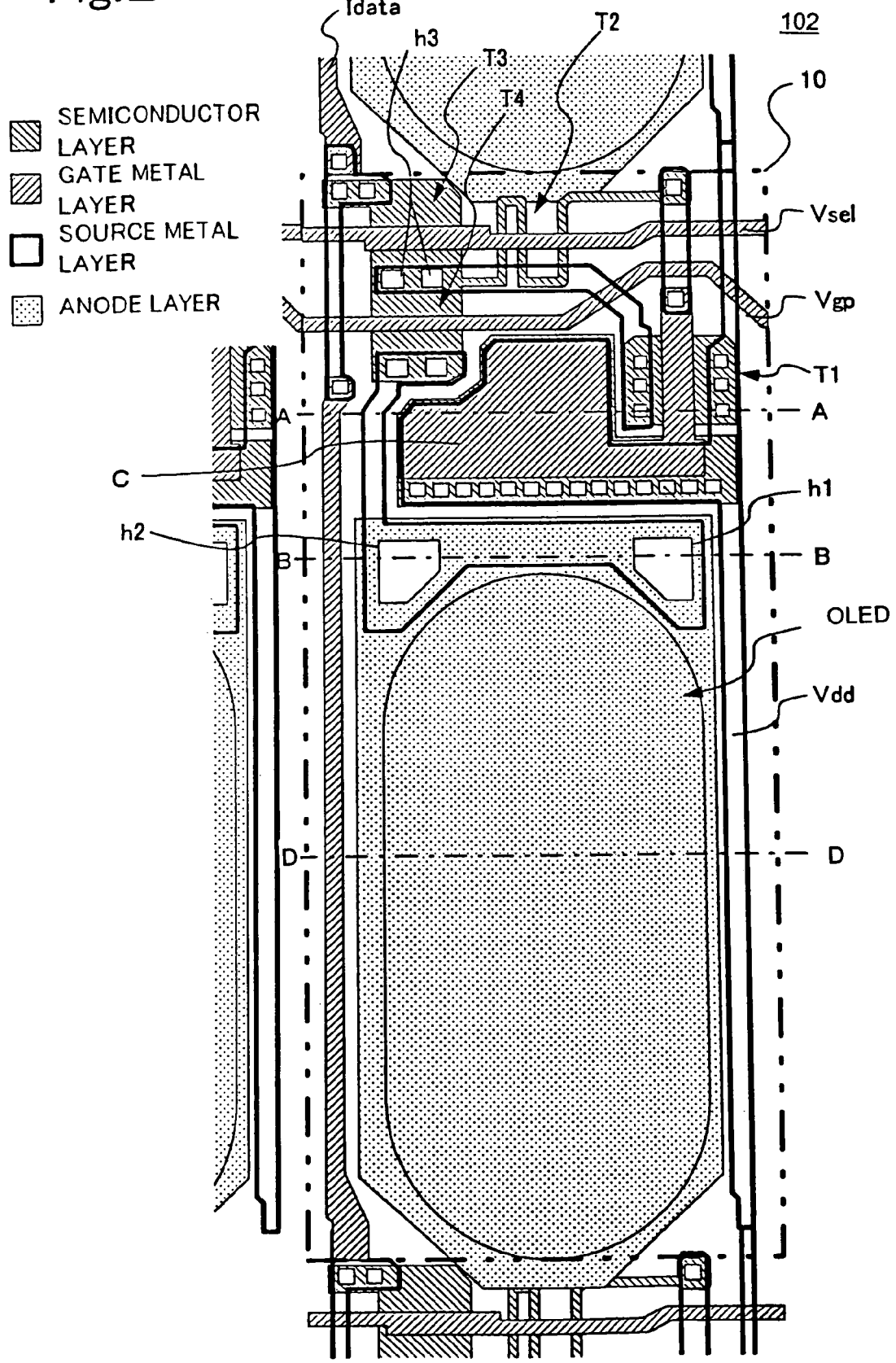
FIG. 2 is a plane view of a pixel region in embodiment 1.

FIG. 2 shows a plane view which explains the wiring pattern in one pixel region and the periphery. In FIG. 2, the patterns can be seen in the semiconductor layer 102, which is particularly important and is shown in FIG. 3, in the gate metal layer 104, source metal layer 106, and anode layer 110.

As shown in FIG. 2, the light-emitting portion OLED and peripheral circuitry to drive this portion are all positioned in the region enclosed by the power supply line Vdd and the data line Idata. The power supply line Vdd is positioned at a distance from the data line Idata, with the light-emitting portion OLED intervening. The peripheral circuit comprises a transistor T1 as a first active element, a transistor T2 as a second active element, a transistor T3 as a current-controlling active element, a transistor T4 as a light emission-controlling active element, and a holding capacitor C as a holding element. No restrictions in particular are placed on the conduction types of the transistors T1 to T4, but in this embodiment, the conduction type of transistor T1 is p type, and that of all the other transistors is n type.

The source of the transistor T1 is connected to the power supply line Vdd, and the drain is connected to the drain side of transistor T4. The source of transistor T4 is connected to the anode of the light-emitting portion OLED. The holding capacitor C is formed between the power supply line Vdd and the gate of transistor T1. The source of transistor T2 is connected to the holding capacitor C and to the gate of transistor T1, and the drain is connected to the drain of transistor T3 and between transistors T1 and T4. The source of transistor T3 is connected to the data line Idata, and the gate is connected, in common with the gate of transistor T2, to the write-control line Vsel.

Figure 3A:
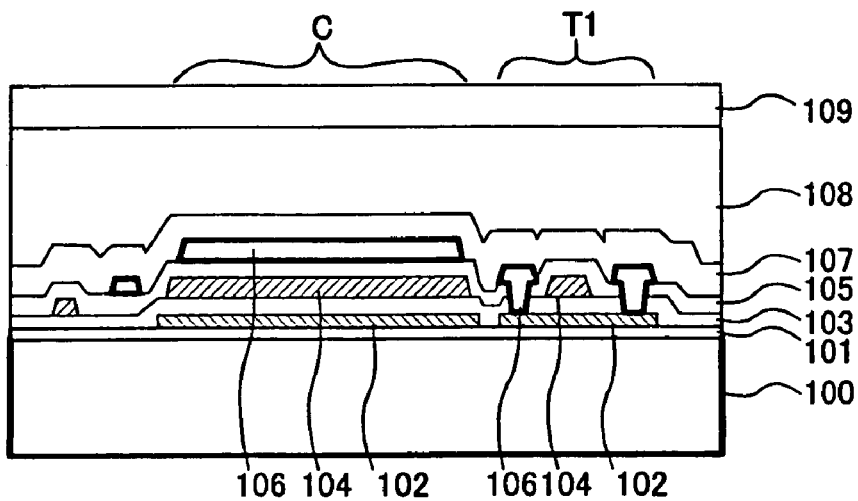
FIG. 3A is a cross-section along A-A in FIG. 2.
Figure 3B:
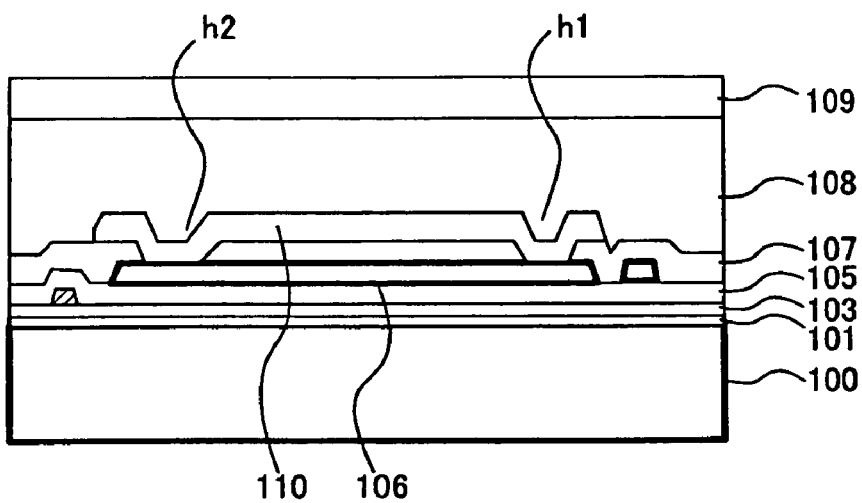
FIG. 3B is a cross-section along B-B in FIG. 2.
Figure 3C:
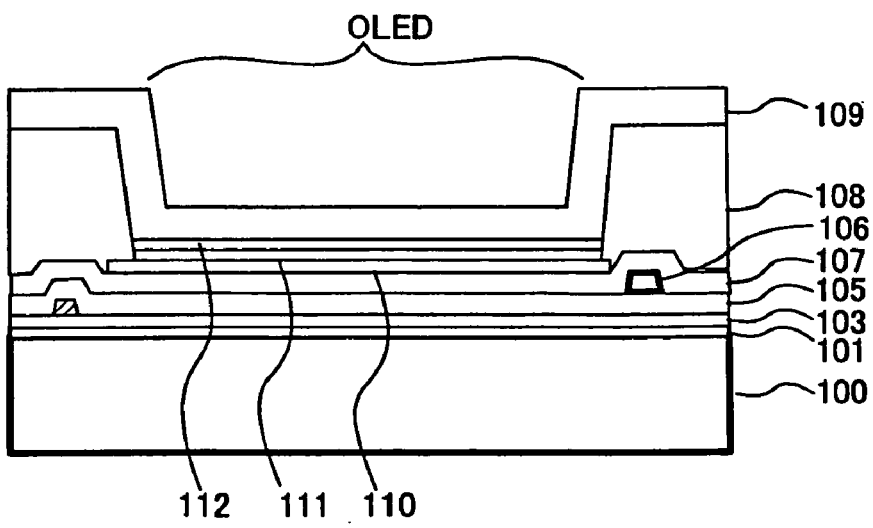
FIG. 3C is a cross-section along C-C in FIG. 2.

FIG. 3 shows cross-sections to explain the layer structure in each of the cross-sectional planes shown in FIG. 2. FIG. 3A, FIG. 3B, and FIG. 3C show the layer structure in the A-A cross-sectional plane, B-B cross-sectional plane, and C-C cross-sectional plane, respectively.

As shown in FIG. 3A, the pixel region 10 is configured by stacking, on the glass substrate 100 (the glass substrate 16 in FIG. 1), an underlayer protection film 101, semiconductor layer 102, gate insulating film 103, gate metal layer 104, first interlaminar insulating film 105, source metal layer 106, second interlaminar insulating film 107, bank layer 108, and cathode layer 109 (the cathode 12 in FIG. 1). Further, as shown in FIG. 3B and FIG. 3C, the electric field light-emitting portion OLED is configured by stacking an anode layer 110, hole transport layer 111, and light-emitting layer 112.

As the glass substrate 100, because the EL elements of this embodiment emit light on the substrate side and it is necessary that light be transmitted, soda lime glass, low-expansion glass, quartz glass, and other non-alkaline glasses are employed. However, when an optically transmissive material is used as the cathode layer 109 and EL elements are configured such that light is emitted from the cathode side, it is also possible to use metal or other conductive materials, as well as silicon carbide (SiC), alumina ($Al_2O_3$), aluminum nitride (AlN), and other non-transparent insulating materials.

As the underlayer protective film 101, silicon oxide film ($SiO_x$: $0<x\leq 2$), silicon nitride film ($Si_3N_x$: $0<x\leq 4$), and other insulating materials can be used. The underlayer protective film is formed in order to prevent sodium (Na) and other mobile ions contained in the glass substrate from penetrating into the semiconductor layer and exerting adverse effects on impurity control in the semiconductor layer.

After first washing the substrate 100 with deionized water and alcohol or another organic solvent, the underlayer protection layer 101 is formed on the substrate by atmospheric-pressure chemical vapor deposition (APCVD), low-pressure chemical vapor deposition (LPCVD), plasma-enhanced chemical vapor deposition (PECVD), or another CVD method, or by sputtering.

As the semiconductor layer 102, in addition to a group IV single-element semiconductor layer of silicon (Si), germanium (Ge) or similar, a complex with a group IV element, such as silicon germanium ($Si_xGe_{1-x}$: $0<x<1$), silicon carbide ($Si_xC_{1-x}$: $0<x<1$), or germanium carbide ($Ge_xC_{1-x}$: $0<x<1$), as well as a compound of group III and group V elements such as gallium arsenide (GaAs) and indium antimonide (InSb), a compound of group II and group VI elements such as cadmium selenide (CdSe), or other different complex compounds such as silicon germanium gallium arsenide ($Si_xGe_yGa_zAs_z$: $x+y+z=1$), can be employed.

The semiconductor layer 102 is formed by first depositing silicon or similar by, for example, the APCVD, LPCVD, PECVD or other CVD method, or by sputtering, evaporation deposition, or other PVD method, and then irradiating with laser light to induce a polycrystalline structure. As the laser light, the fundamental and higher harmonics of an excimer laser, argon ion laser, or YAG laser are used as appropriate. For example, when a polycrystalline structure is induced in silicon, polysilicon is obtained. This polycrystalline semiconductor layer 102 is patterned so as to be compatible with the element shapes of the holding capacitance C and each of the TFTs (thin film transistors) T1 to T4. For example, by performing reactive ion etching using a mixture of $CF_4$ and oxygen gases, a semiconductor layer in an amorphous state can be patterned into an island morphology compatible with element shapes. After patterning, for example, a gate metal layer is formed, and then the gate metal layer is used as a mask to introduce impurities into the semiconductor layer. Specifically, phosphorus (P), arsenic (As), antimony (Sb), or other donor elements are added for each element to obtain n-type semiconductor layer, and boron (B), aluminum (Al), gallium (Ga), indium (In), and other acceptor elements are added to obtain p-type semiconductor layer. In this embodiment, impurities are introduced such that the semiconductor layer constituting the holding capacitor C are n-type semiconductor layer. When TFTs with an LDD structure are employed and the threshold voltage of the TFTs is to be adjusted, channel doping to introduce impurities in low concentrations is performed.

As the gate insulating film 103, for example, a silicon dioxide film is formed using tetraethyl orthosilicate (TEOS) as the raw material. The gate insulating film 103 is formed by, for example, plasma CVD in a microwave-discharge plasma, ECR plasma, or other oxygen or nitrogen atmosphere.

As the gate metal layer 104, a conductive material such as, for example, tantalum (Ta), tungsten (W), chromium (Cr), or aluminum (Al) is used. The gate metal layer 104 is formed by first depositing a film by sputtering or other means, and then patterning into the shape of a gate electrode.

As the first interlaminar insulating film 105, silicon oxide, silicon nitride, or some other insulating film can be used. The first interlaminar insulating film is formed by sputtering or similar, and, for example, contact holes are then formed in order to form TFT source and drain electrodes.

As the source metal layer 106, in addition to aluminum (Al), for example, tantalum, molybdenum, titanium, tungsten, or some other conductive material can be used. The source metal layer is formed by using sputtering or another method to uniformly layer a conductive material, and then patterning according to the electrode shape.

As the second interlaminar insulating film 107, silicon oxide, silicon nitride, or some other insulating film can be used. The second interlaminar insulating film is formed by sputtering or other means, and then, for example, contact holes h1 and h2 for the anode layer 110 are formed.

As the anode layer 110, for example, indium tin oxide (ITO) alloy or some other optically transmissive conducting material can be used. When there is no need for optical transmission properties, tin oxide (NESA), gold, silver, platinum, copper, or another material can be used as the anode layer. After using sputtering or some other method to form the anode layer, patterning is performed according to the shape of the light-emitting portion OLED. No restrictions in particular are placed on the shape of the anode layer (or the pixel electrodes), but it is desirable that the area be larger than that of the light-emitting portion OLED. Through such a configuration, a contact region for electrical connection of a peripheral circuit or pixel circuit with the pixel electrodes can be provided in a region other than the light-emitting portion of the pixel electrodes. Through such a configuration, the flatness of, at least, the light-emitting portion can be improved.

As the bank layer 108, silicon oxide, silicon nitride, polyimide, or some other insulating material can be employed. The bank layer is formed by deposition using sputtering or a similar method, after which an aperture portion is provided in a position corresponding to the light-emitting portion OLED.

As the hole transport layer 111, for example, N,N'-diphenyl-N,N'-bis-(3-methylphenyl)-(1,1'-biphenyl)-4,4'-diamine (TPDA) is used. The hole transport layer is deposited in the aperture portion provided in the bank layer 109, using a metal mask or similar.

As the light-emitting layer 112, for example, tris-(8-quinolinol) aluminum ($Alq_3$) or another arbitrary light-emitting material is used. The light-emitting layer can be formed by evaporation deposition using a metal mask or silicon mask; however, an ink jet method may be employed to arrange a solvent comprising the light-emitting material in the aperture portion, after which the solvent component is caused to evaporate.

As the cathode layer 109, a material the energy level of which enables use as the cathode of an EL element, such as aluminum or an alloy of aluminum with another element (such as lithium), or calcium or similar, is used. The cathode layer is formed using a metal mask or similar, and is patterned by photolithography or using a shadow mask method.

In this embodiment, pixel electrodes are anodes and the common electrode is a cathode; however, a configuration may be employed in which the pixel electrodes are cathodes and the common electrode is a anode. Typically, cathode materials are often metals, but when the pixel electrodes are cathodes, the light emitted by the light-emitting portion OLED is then emitted on the side opposite the substrate 100. Of course, even when the pixel electrodes are anodes and the common electrode is a cathode, by using a transparent material as the cathode material, or by making the film thickness sufficiently thin that light is transmitted, light can be emitted on the side opposite the substrate 100.

Below, several features regarding wiring patterns in this embodiment are explained in sequence.

Planar Shape of the Light-Emitting Portion

One method of manufacture of EL elements involves using an ink jet method to discharge a liquid material comprising a light-emitting material, carrier transport material or carrier blocking material into an aperture portion, followed by drying, to form the light-emission layer. In this manufacturing method, it is important that the discharged liquid material extend uniformly to all areas of the aperture portion. If the liquid material does not extend uniformly, the thickness of the light-emitting layer after film deposition is uneven, the intensity of light emitted within the light-emitting region is uneven, and the image quality of the display panel is diminished. If for example it is supposed that the planar shape of the aperture portion is square, then under the influence of the surface tension and viscosity of the liquid material, the height of the surface of the liquid material discharged into the corners of the aperture portion will differ from other areas. Hence there is the possibility that for a light-emitting portion with such a shape, the thickness of the light-emitting layer after film formation will be uneven.

On the other hand, there is a need to increase the brightness of the display panel, and so there are requests to increase insofar as possible the size of the region in which light is emitted, that is, the light-emitting portion, and to reduce insofar as possible the region occupied by peripheral circuitry, that is, to raise the aperture ratio. The pattern layout cannot be designed considering only the ease of manufacture.

In order to satisfy all these requests, in this embodiment the boundaries of the light-emitting portion are formed so as to have at least a prescribed curvature, and at least a portion of the peripheral circuit is formed in the region surrounded by these boundaries having the prescribed curvature and the boundaries of a polygon circumscribing the boundaries of this light-emitting portion.

Figure 4A:
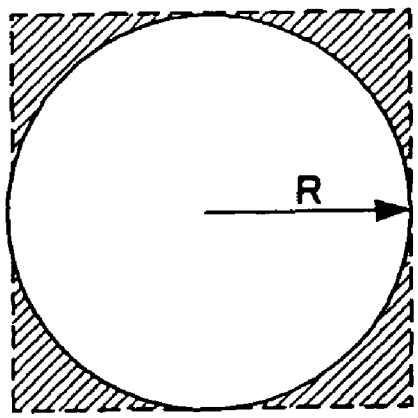
FIG. 4A shows the case of a circular light-emitting portion.
Figure 4B:
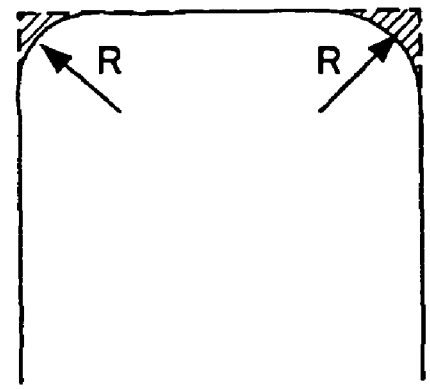
FIG. 4B shows the case of a light-emitting portion having a curved portion symmetrical about a center line.
Figure 4C:
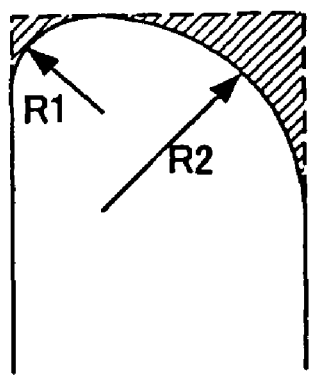
FIG. 4C shows the case of a light-emitting region having a curved portion asymmetrical about a center line.

Based on FIG. 4, a specific concept is explained. FIGS. 4A, 4B and 4C show, partially or entirely, the planar shape of a light-emitting portion to which the concept of this invention is applied. FIG. 4A is the case in which the boundary of the light-emitting portion is circular, that is, the entire boundary has a fixed curvature R. A portion of the peripheral circuit is provided within the region, indicated by shading, enclosed by this circle and by a polygon circumscribing the circle, that is, the square shown by a broken line. The light-emitting portion of this circle is regarded as having an ideal shape for rendering uniform the film thickness of the light-emitting portion, insofar as the shape is symmetrical about any center line passing through the center. However, as shown in FIG. 4A, effective utilization of the shaded portion is necessary in order to improve the aperture ratio of the light-emitting portion.

FIG. 4B is an example in which this invention is applied to the corners of a rectangular shape; in this example, the boundaries of the light-emitting portion are provided with a fixed curvature R. In this example, the circumscribing polygon is a rectangle, shown by a broken line; the shaded regions surrounded by the boundaries of the light-emitting portion and the boundaries of the rectangle are the regions in which a portion of, or the entirety of, the peripheral circuit is provided. The present embodiment pertains to this example; as the curvature R is increased, an oblong planar shape for the light-emitting portion results, such as in this embodiment. In this example also, the shape is symmetrical laterally and vertically about a center line passing through the center of the light-emitting portion, and moreover the curvature of the corner portions is equal to or greater than a fixed value, so that a light-emitting portion with uniform film thickness can be formed.

FIG. 4C is an example in which the curvature of the corner portions is set to be unequal with respect to a center line. The curvature R1 of the corner portion on the left side facing the drawing is smaller than the curvature R2 of the corner portion on the right side.

In this example, the circumscribing polygon is a rectangle, shown by a broken line, and the shaded regions surrounded by the boundaries of the light-emitting portion and the boundaries of the rectangle are regions in which a portion of or the entirety of the peripheral circuit is provided. Even when the curvature is unequal in this way, by setting the minimum curvature to be greater than or equal to a constant value, a light-emitting portion with uniform film thickness can be formed. Because the minimum curvature is affected by the viscosity and surface tension of the discharged solution, and by the water repellence or liquid repellence (affinity to water or to liquids) of the discharge surface, the minimum curvature should be determined by experiment for each set of conditions.

In this embodiment, a light-emitting portion with a rectangular planar shape, such as shown in FIG. 2, is adopted. And, a portion of the peripheral circuit, namely, the contact holes h1 and h2 (see FIG. 3B), is formed within the region surrounded by the boundaries of the light-emitting layer and the boundaries of the rectangle (not shown) circumscribing the boundaries of the light-emitting portion. In this embodiment, the regions indicated by shading in FIG. 4B which normally are wasted space are used for these contact holes, and this satisfy demands for effective use of space.

In addition to contact holes, any other elements of the peripheral circuit, such as for example transistors and capacitors, may be formed in the regions surrounded by the boundaries of the light-emitting portion and the boundaries of a polygon circumscribing the light-emitting portion. Moreover, it is not necessary to include the entirety of an independently functioning element in these regions; a portion of an element or contact, that is, a portion of the peripheral circuit, may be included in the region. In other words, it is essential that placement be performed so as to make effective use of space.

In cases where a liquid material is not used to form the light-emitting portion, even when, for example, evaporation deposition or similar is used to form the light-emitting portion, by employing a shape in which the edge portions of the light-emitting portion have a curvature, there is the enduring advantage that the danger of short-circuits between the pixel electrode at the edge portions of the light-emitting portion OLED and the common electrode is reduced.

Strictly speaking, a curvature can be represented as a collection of fine straight lines, and so the shape of the light-emitting portion can be interpreted as a polygon having more numerous vertices than the shape of the pixel electrode.

Contact Holes for the Light-Emitting Portion

In an EL element, provision of a contact hole in a region surrounded by the boundaries of the light-emitting portion and the boundaries of a polygon circumscribing the light-emitting portion, as shown in FIG. 2, is significant. In other words, by providing a comparatively large contact hole in this region, the region can be used effectively, and sufficient current can be supplied to the light-emitting portion.

It is further preferable that a plurality of contact holes be provided. That is, in the EL element, a certain amount of current in the light-emitting layer must be passed uniformly to the entirety of the light-emitting portion. If a contact hole used for connection to an anode directly supplying current is provided in an eccentric position, the supply of current may be uneven. An uneven supply of current appears as irregularities in the intensity of light emission.

If, as in this embodiment, a plurality of contact holes are provided in positions which are symmetrical with respect to a center line passing through the center of the light-emitting portion, then this problem can be resolved. That is, as shown in FIG. 2, in this embodiment a plurality of comparatively large contact holes are provided in regions provided symmetrically with respect to a prescribed center line passing through the center of the light-emitting portion. By providing these contact holes in symmetrical regions, the demand for uniform film deposition in the light-emitting portion, as well as the demand that current supplied to the light-emitting portion be uniform, can both be satisfied.

Alignment of Metal Layers

Depending on the EL element driving method, the stability of the current supplied to the light-emitting portion may be affected by fluctuations in the holding capacitance. In this embodiment also, it is undesirable for the capacitance value of the holding capacitor C to fluctuation either from one pixel to another, or from one display panel to another. However, when stacking metal layers in a process to manufacture a display panel, there may occur shifts from planned positions. Because the numerical area of overlapping metal layers determines the holding capacitance, shifts in position give rise to fluctuations or scattering in capacitance values, and there are cases in which capacitance values of holding capacitances may cause fluctuations either among pixel regions, or among display panels.

Hence in this embodiment, in the vicinity of overlapping regions forming the holding capacitor C, among the plurality of layers related to formation of the holding capacitor C, that is, among the source metal layer 106, gate metal layer 104, and semiconductor layer 102, the occupied region or width of a layer positioned on the lower side (relative to the source metal layer, the gate metal layer and semiconductor layer) is formed to be larger than the occupied region or width of the layer positioned on the upper side (relative to the semiconductor layer, the gate metal layer and source metal layer; relative to the gate metal layer, the source metal layer).

Figure 6:
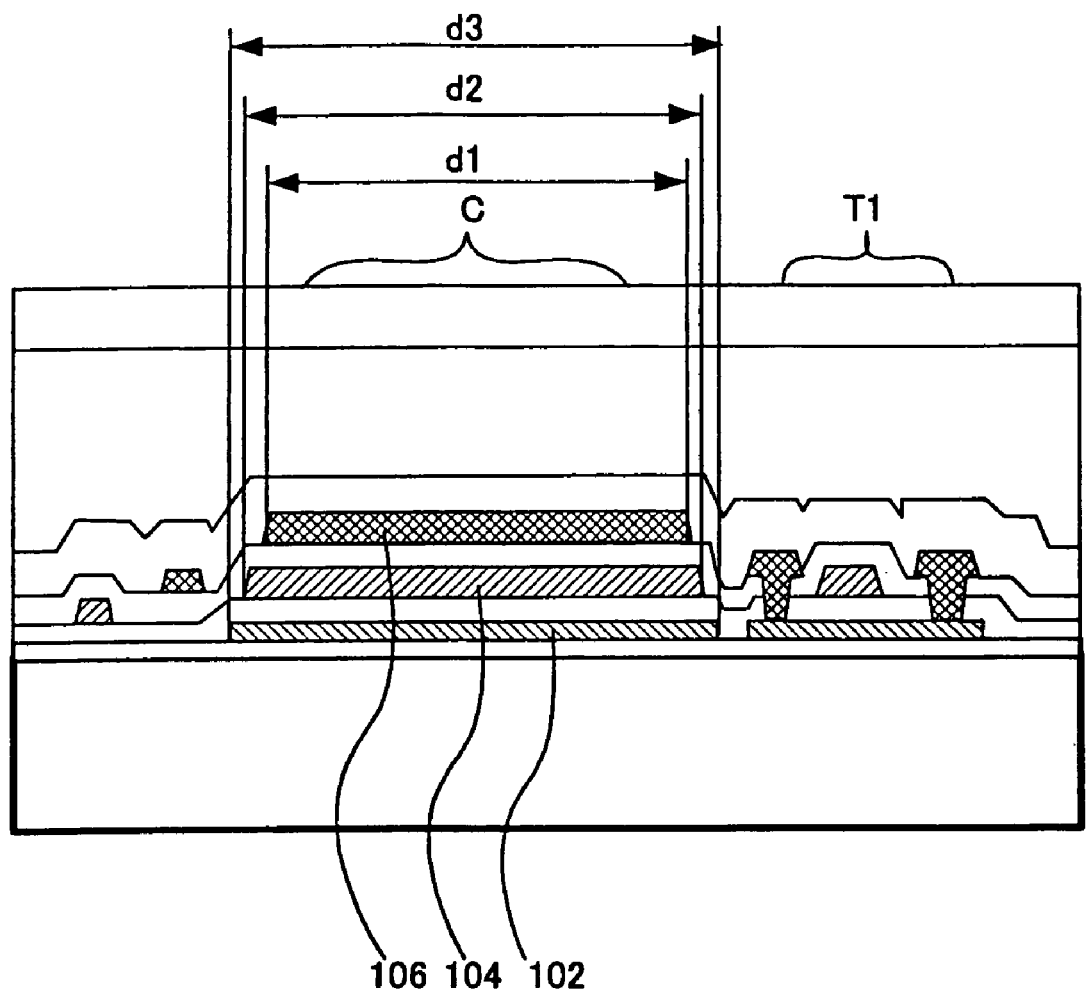
FIG. 6 is a drawing explaining the alignment of a metal layer in embodiment 1.

This feature can be seen in the plane view of FIG. 2, but is explained in greater detail referring to the A-A cross-section shown in FIG. 6. As shown in FIG. 6, if the width of the source metal layer 106 is d1, the width of the gate metal layer 104 is d2, and the width of the semiconductor layer 102 is d3, then the relation d3>d2>d1 obtains. The lower the layer, the larger is the pattern shape.

The extent to which [the pattern shape] should be increased will vary depending on the precision of the manufacturing processes and the pattern density. As one approach, patterns should be formed for each layer such that, when forming layers positioned on the upper side, even when the maximum possible shift in position occurs, the region in the layer positioned on the upper side will be contained within the region in the layer positioned on the lower side. In this embodiment also, the differences d3−d2 and d2−d1 are designed to be equal to or greater than predicted position shifts in manufacturing processes.

Formation of Separations between Gate Metal Layers

EL elements comprise a common electrode; the common electrode is formed over the entirety of the display region. In this embodiment also, a cathode 13 (cathode layer 109) is formed over the entirety of the display region 11 as shown in FIG. 1 as the common electrode for the light-emitting portion OLED. However, if the common electrode is formed over the entirety, there is the problem that a capacitance occurs with the gate metal layer connected to the gates of transistors. If such stray capacitance appears, lags occur in transistor operation, and operation with the timing of the design cannot be guaranteed.

Figure 7:
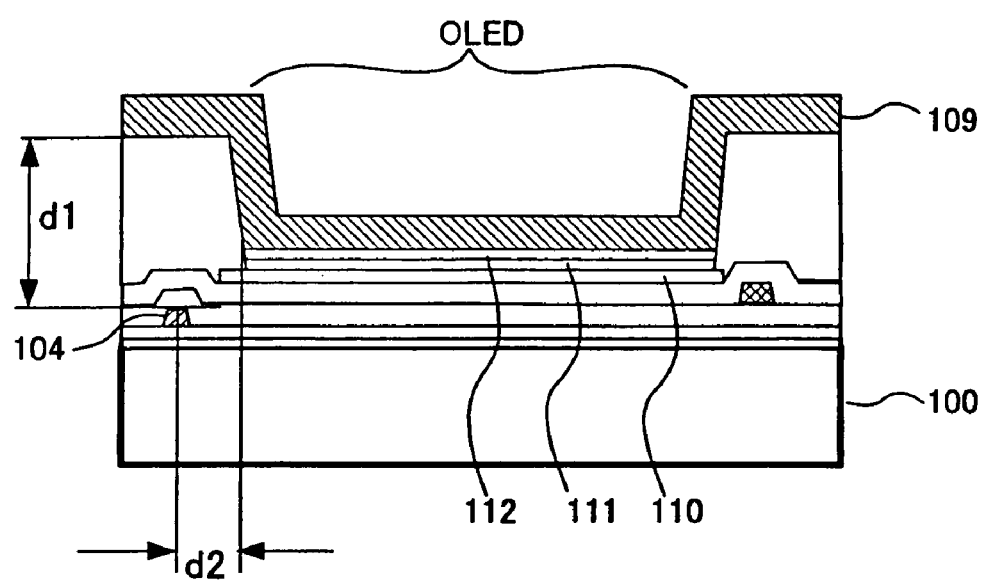
FIG. 7 is a drawing explaining processing to separate gate metal in embodiment 1.

Hence in this embodiment, the wiring pattern formed by the gate metal layer is positioned with a separation of at least a prescribed distance from at least one among the electrodes of the light-emitting layer. A problem due to low impedance arises due to the distance between the cathode layer 109 which is the common electrode and the gate metal layer 104. Also, the cathode layer 109 is a small distance from the lower side in the light-emitting portion OLED, so that the distance from the gate metal layer in the vicinity of the light-emitting portion poses a problem. Hence in this embodiment, as shown in FIG. 7 (equivalent to the C-C cross-section in FIG. 2), patterns are formed such that, near the light-emitting portion, the distance d1 in the depth direction between the cathode layer 109 and the gate metal layer 104 and the distance d2 in the plane are both equal to or greater than a prescribed distance.

Here the prescribed distance will change variously depending on the area of the gate metal layer and the dielectric constants of intervening layers, and so cannot be specified generally; however, it is preferable that patterning should be at as great a distance as possible, within the range allowed by the area of pixel regions and other.

Wiring to supply data signals, scan signals, and other electrical signals must be laid out in consideration of operation delays caused by stray capacitances. In this embodiment, the data lines Idata and scan lines Vsel use the gate metal layer 104 which is at a greater distance from the cathode 109 which is a common electrode, and at the intersections between data lines Idata and scan lines Vsel, data lines Idata are formed in the source metal layer 106, but the portions of data lines Idata outside intersections and the scan lines Vsel are formed in the gate metal layer 104.

When it is necessary to further reduce the stray capacitances to which data lines Idata contribute, the entirety of the data lines Idata may be formed in the conducting layer which is at the greatest distance from the common electrode. To give an explanation corresponding to this embodiment, at the intersections between data lines Idata and scan lines Vsel, scan lines Vsel are formed in the source metal layer 106, and the entirety of data lines Idata as well as the portion of scan lines Vsel outside intersections may be formed in the gate metal layer 104.

In order to remove signals lines such as scan lines and data lines farther from the common electrode and from pixel electrodes, a conducting layer may be formed in the same layer as the semiconductor layer 102; and, if a so-called bottom-gate configuration for transistors is employed, then the conducting layer may be provided below the semiconductor layer, and this conducting layer can be used for wiring of signal lines.

Operation of Peripheral Circuits

Figure 5:
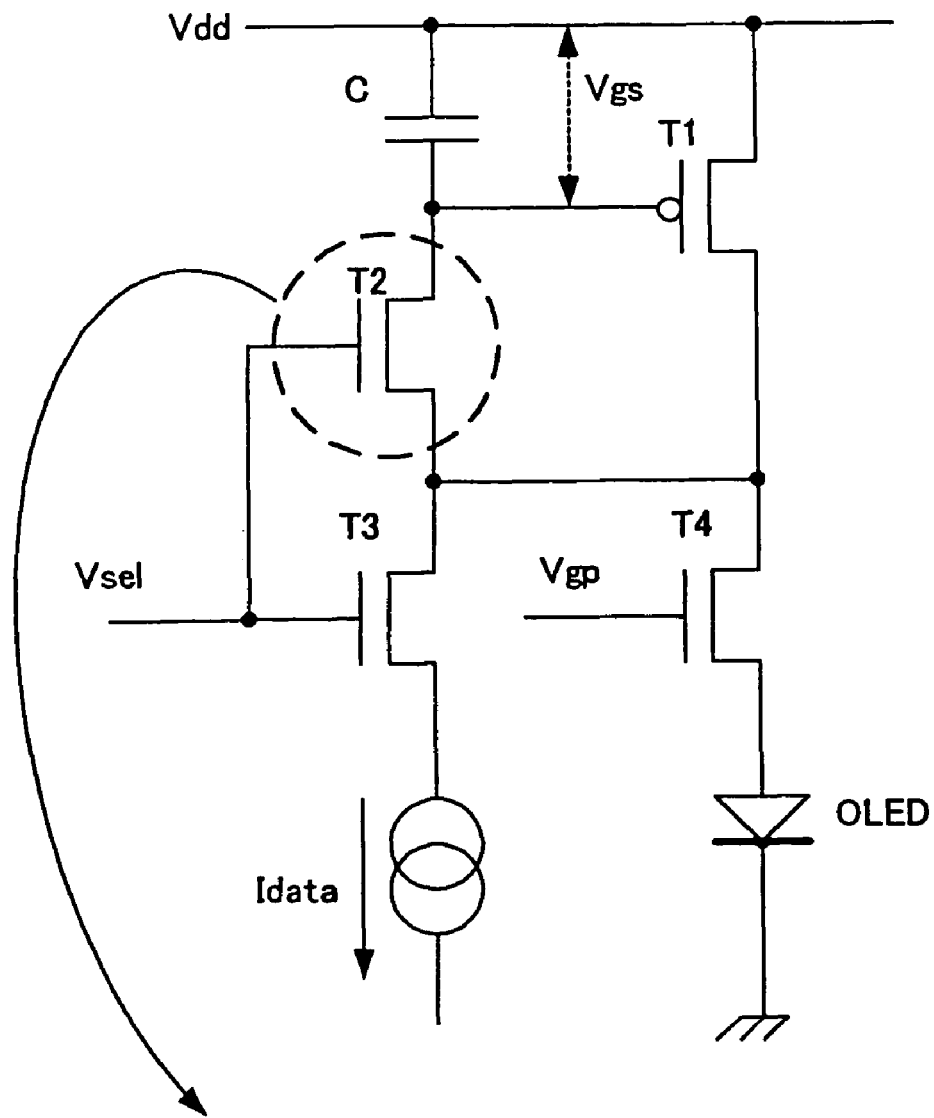
FIG. 5 is a circuit diagram of a pixel region in embodiment 1.

Next, the operation of the peripheral circuit of an EL element of this embodiment is explained. FIG. 5 shows a circuit diagram for one pixel circuit constituting the pixel region 10.

1) The circuit of this embodiment has a circuit configuration which operates through the supply of current data as data signals. Pixel display begins with the selection of the write control line Vsel as a data writing operation, putting the transistors T2 and T3 into the turned-on state.

2) When the transistors T2 and T3 are put into the conducting state, the transistor T1 reaches a steady state after a prescribed time, and electric charge accumulates in the holding capacitor C according to the data current Cdata.

3) As light emission action, the write control line Vsel is put into the unselected state, the transistors T2 and T3 are turned off, and after stopping supply of the data current Cdata, the light emission control line Vgp is selected. As a result, the transistor T4 is turned on, and a current corresponding to the potential difference Vgs between the voltage stored in the holding capacitor C and the power supply voltage Vdd is supplied to the light-emitting portion OLED via the transistors T1 and T4, so that light is emitted from the light-emitting layer.

Improvement of Current Maintenance Performance in Peripheral Circuits

Below, features of this embodiment in the peripheral circuitry are explained.

In the prior art, no consideration in particular has been paid to active elements controlling the charging and discharging of holding capacitances. In miniaturized FETs, when the gate voltage is below the threshold, the drain current also depends on the drain voltage. That is, the injection current in the source-drain channel increases as an exponential function of the gate voltage, and leakage currents occur. For example, when a leakage current occurs in transistor T2 shown in FIG. 5, the cross-terminal voltage Vgs of the holding capacitor C deviates from the value corresponding to the supplied data signal, and the drain current of the transistor T1 which takes this voltage as a control voltage for input to its gate fluctuates. This fluctuation appears as a change in brightness in the light-emitting portion OLED, so that light emission at a stable brightness can no longer be guaranteed.

Hence in this embodiment, as shown in FIG. 1 and FIG. 5, transistor T2 which is an active element directly connected to the holding capacitor C is an active element with multiple control terminals, that is, a multi-gate type transistor. Using such a transistor, as indicated by the arrow in FIG. 5, is for practical purposes equivalent to directly connecting a plurality of transistors, and the leakage current is greatly suppressed. A current corresponding to the supplied data signal is reliably supplied to the light-emitting portion OLED.

As the transistor T2, instead of, or in addition to, a multi-gate type structure, an LDD, GDD, or DDD structure can also be employed. By employing such a structure, the leakage current can be reduced, and adverse effects due to hot electrons when a FET is miniaturized are suppressed, so that element reliability is enhanced.

In this embodiment, in consideration of the polarity of control signals, transistor T1 and transistor T2 have opposite polarities, that is, transistor T1 is a p-type FET, and transistors T2 to T4 are n-type FETs. However, whether to use a p-type or an n-type [transistor] can be decided arbitrarily according to the polarity and other details of signals which are to be used, and no restrictions apply.

Moreover, the placement of elements is not limited to that of FIG. 5. For example, the electrical potential relationships of the holding capacitor, transistor T1, and light-emitting portion OLED can be reversed. In this case, it is desirable that the common electrode of the light-emitting portion be an anode, and that the polarities of each of the transistors (whether n-type or p-type) be reversed.

Reduction of Peripheral Circuit Space

As explained above, in order to increase the brightness or aperture ratio in a display device, it is demanded that the region occupied by peripheral circuitry be decreased as much as possible. To this end, in this embodiment a wiring pattern is formed such that at least one active element among the plurality of transistors and other active elements is connected to another active element by the same contact hole. Specifically, as shown in FIG. 2, transistors T2, T3, and T4 are interconnected by the same contact hole h3. In this way, the layout is optimized such that there are more numerous common connection points or contacts in a circuit, and by arranging elements such that portions which are common contact points are connected by the same connection points, the number of contact holes can be reduced and the area occupied by the peripheral circuitry is reduced due to these contact holes.

Embodiment 2

Figure 8:
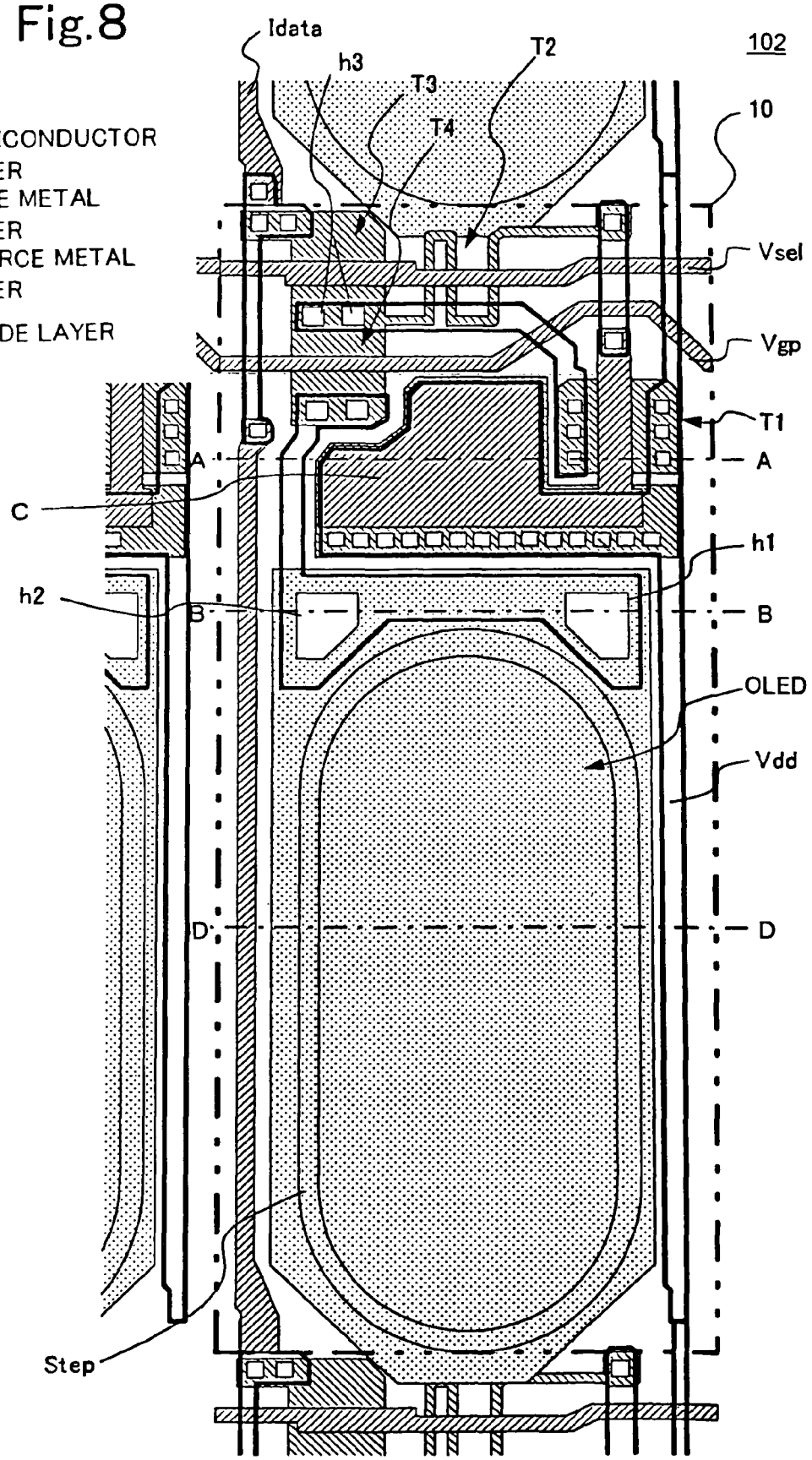
FIG. 8 is a plane view of a pixel region in embodiment 2.
Figure 9A:
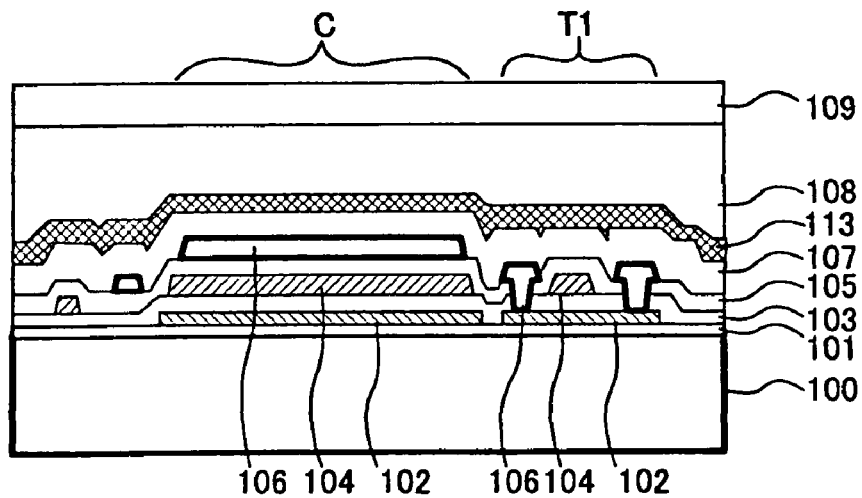
FIG. 9A is a cross-section along A-A in FIG. 8.
Figure 9B:
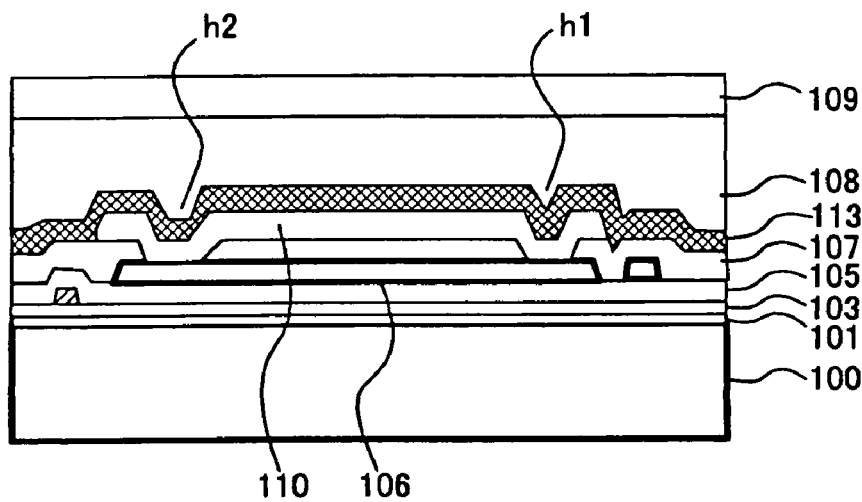
FIG. 9B is a cross-section along B-B in FIG. 8.
Figure 9C:
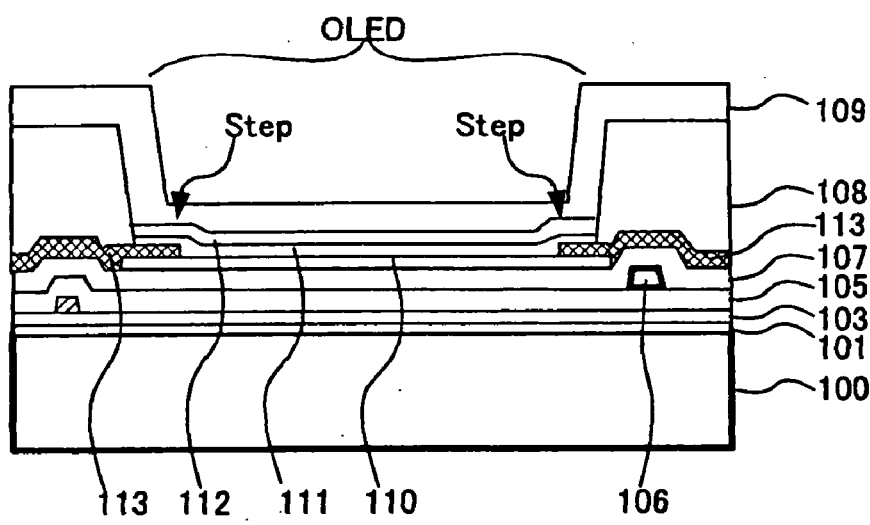
FIG. 9C is a cross-section along C-C in FIG. 8.

FIG. 8 shows a plane view explaining one pixel region and the wiring pattern in the vicinity thereof for an EL element of embodiment 2 of this invention. FIG. 9 shows cross-sectional views which explain the layer structure in cross-sections of FIG. 8. FIG. 9A shows the layer structure in a cross-section along the A-A plane, FIG. 9B is a cross-section along B-B, and FIG. 9C is a cross-section along C-C. In these drawings, similarly to embodiment 1, the patterns of the principal semiconductor layer 102, gate metal layer 104, source metal layer 106, and anode layer 110 are shown.

The configuration of the EL element in embodiment 2 is, except for the existence of an affinity-controlling film 113 which forms a step shape, similar to the EL element of embodiment 1. Hence components similar to those of embodiment 1 are assigned the same symbols in the drawings, and explanations are omitted.

Below, features of this embodiment are described.

Affinity-Controlling Layer

As shown in FIG. 9C, the light-emitting portion OLED in embodiment 2 comprises an affinity-controlling layer 113, between the second interlaminar insulating film 107 and the bank layer 108. This affinity-controlling layer 113 need not be formed over the entire pixel region, but when forming a light-emitting portion OLED using a liquid material, should preferably be provided at least near the boundaries of the light-emitting portion. The affinity-controlling layer 113 must have an affinity for the liquid material used in forming the light-emitting portion. In this embodiment, the bank layer 108 forms a wall near the boundary of the light-emitting portion; a material is selected which exhibits no affinity for the liquid material used when forming the light-emitting layer 110, and [the bank layer] is stacked on top of the affinity-controlling layer 113. Consequently the affinity-controlling layer 113 forms a step shape Step on the inside of the light-emitting portion in the wall formed by the bank layer, as shown in FIG. 8 and FIG. 9C.

The material of the affinity-controlling layer 113 is determined according to the kind of properties of the liquid material which is used to fill the light-emitting region by the ink jet method. For example, if the liquid material comprises a liquid such as water which is highly polar, it is desirable that the affinity-controlling layer have polar bases, at least in the portion making contact with the liquid material or on the surface. Conversely, if the liquid material comprises a nonpolar liquid, it is desirable that the affinity-controlling layer have nonpolar bases, at least in the portion making contact with the liquid material or on the surface. Also, the extent of the affinity of the affinity-controlling layer is determined by the surface tension of the liquid material which fills the light-emitting region.

For example, even if a material which chemically has a weak affinity for water is used as an affinity-controlling layer, if the liquid material comprises large quantities of a solvent with a surface tension lower than that of water, the surface tension of the liquid material will be lower than that of water, and so the affinity-controlling layer will exhibit affinity for the liquid. Hence the type of material to use in the affinity-controlling layer is changed variously according to the liquid material to be used.

It is preferable that the affinity-controlling layer 113 comprise an inorganic compound or organic compound which in turn comprises one among Al, Ta or another metal, silicon oxide, silicon nitride, amorphous silicon, polysilicon, polyimide, an organic compound with fluoride bonds, or a photoresist. If insulating properties are necessary, the affinity-controlling layer comprises a nonmetallic compound. The affinity of these materials is determined by differences in the contact angle with respect to the liquid material. That is, the degree of affinity or absence of affinity is determined in relative and not absolute terms. The degree of affinity can also be adjusted through surface treatment methods.

It is preferable that the bank layer 108 comprise a material with weaker affinity than the affinity-controlling layer 113. This is because, by making the affinity of the bank layer weaker than that of the affinity-controlling layer, the absence of affinity of the bank layer can repel the liquid material to prevent flowing of the liquid material into neighboring pixel regions and avoid short-circuits. Also, the absence of affinity of the bank layer prevents liquid material from being drawn excessively toward the bank layer side so that a concave-shape film is formed.

Thus in this embodiment, an affinity-controlling layer with an affinity for the liquid material is provided near the boundaries of the light-emitting portion, so that a light-emitting layer of uniform film thickness can be formed.

In this way, according to this embodiment, an affinity-controlling layer with affinity for the liquid material is provided near the boundaries of the light-emitting portion, so that the uniformity of the thickness of the hole injection layer, light-emitting layer, and other layers constituting the light-emitting portion is improved.

In this embodiment, the affinity-controlling layer 113 is formed in a step shape; but when the thickness of the layer cross-section can be made sufficiently great, walls without a step shape, that is, a single wall without a step with the bank layer, may be formed.

Other advantageous results of embodiment 2 are similar to those of embodiment 1, and an explanation is omitted.

Embodiment 3

Figure 10:
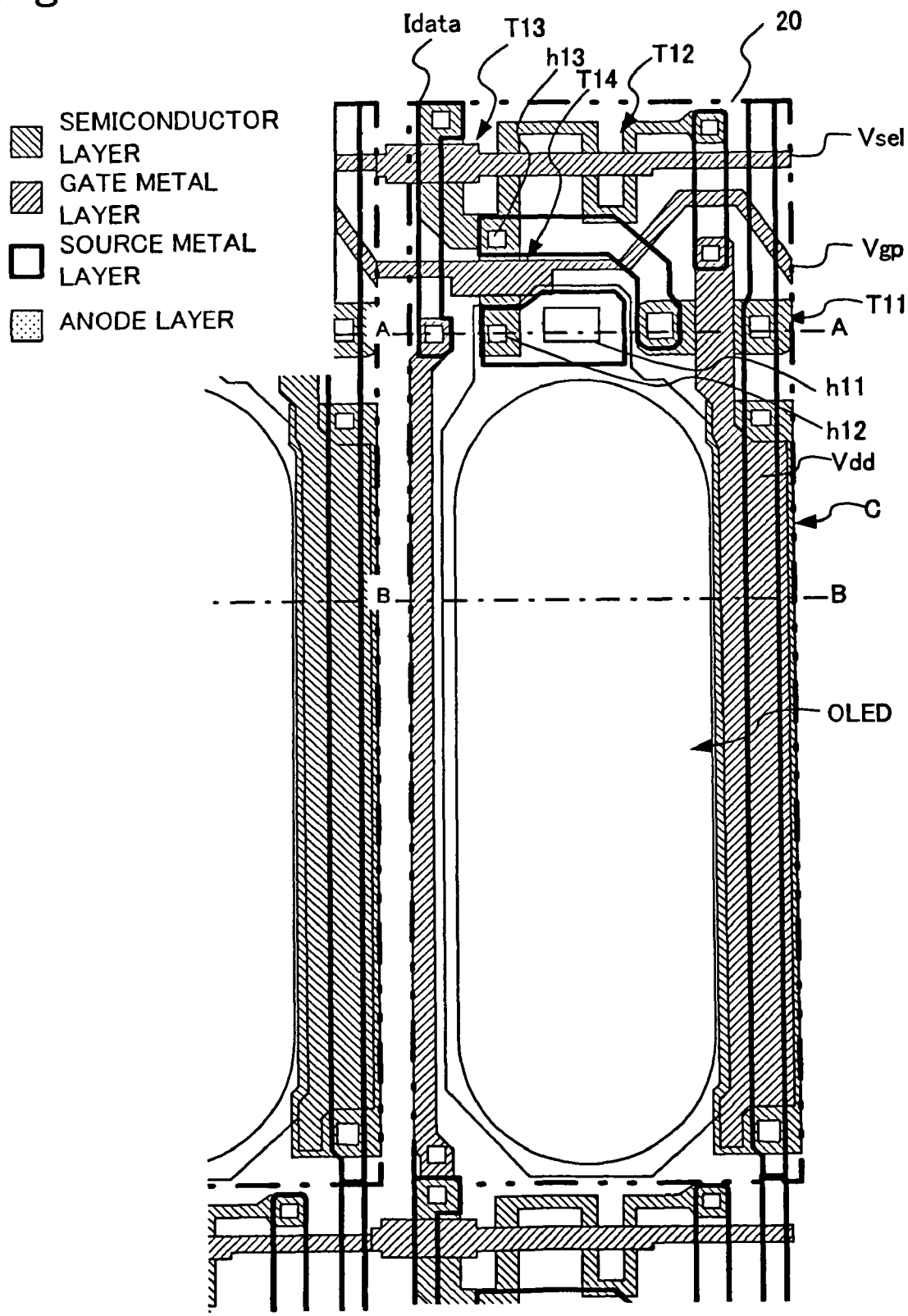
FIG. 10 is a plane view of a pixel region in embodiment 3.
Figure 11A:
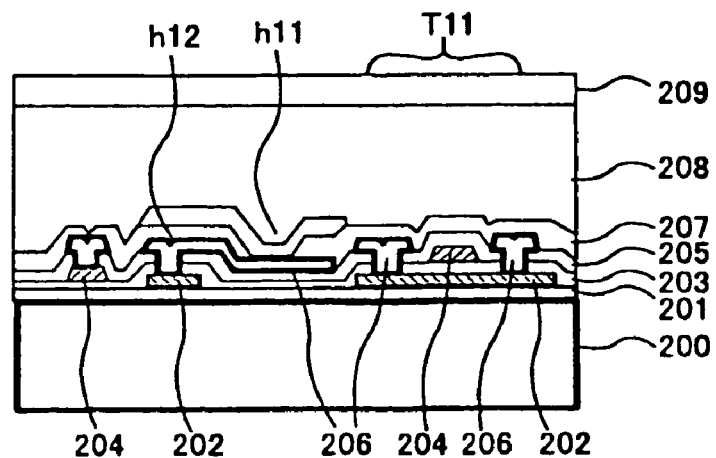
FIG. 11 shows cross-sectional views of a pixel region in embodiment 3.
Figure 11B:
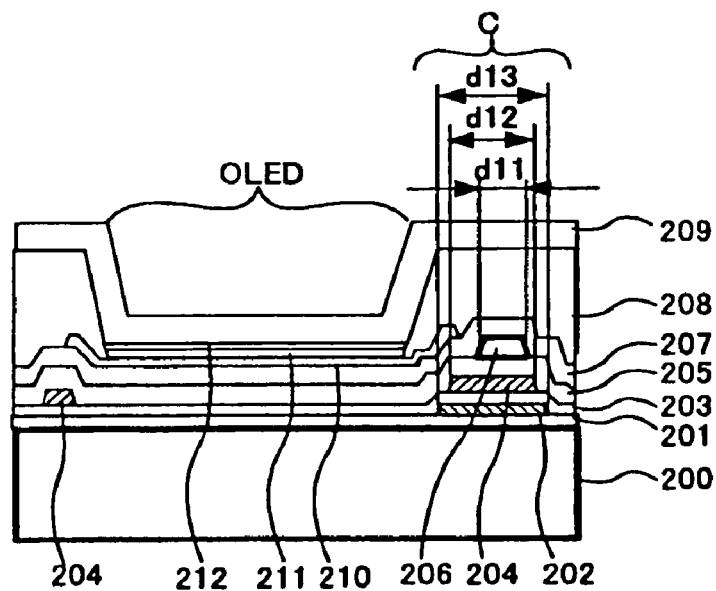

FIG. 10 shows a plane view which explains one pixel region and the peripheral wiring pattern for an EL element in embodiment 3. FIG. 11 shows cross-sectional views explaining the layer structure in cross-sections indicated in FIG. 10. FIG. 11A and FIG. 11B show the layer structures in the cross-sections along A-A and B-B respectively in FIG. 10. In these drawings, similarly to embodiment 1, patterns in the principal semiconductor layer 202, gate metal layer 204, source metal layer 206, and anode layer 210 can be seen.

In the pattern shape of the EL element in embodiment 3, the width of the pixel region 20 is smaller than the width of the pixel region 10 in embodiment 1. However, the circuit configuration is similar to that of embodiment 1 (see FIG. 5), and the materials forming each layer are also similar to embodiment 1, and so components which are the same as in embodiment 1 are assigned the same symbols in the drawings, and explanations are omitted. The glass substrate 100, underlayer protection film 101, semiconductor layer 102, gate insulating film 103, gate metal layer 104, first interlaminar insulating film 105, source metal layer 106, second interlaminar insulating film 107, bank layer 108, cathode layer 109, anode layer 110, hole transport layer 111, and light-emitting layer 112 in embodiment 1 correspond, respectively, to the glass substrate 200, underlayer protection film 201, semiconductor layer 202, gate insulating film 203, gate metal layer 204, first interlaminar insulating film 205, source metal layer 206, second interlaminar insulating film 207, bank layer 208, cathode layer 209, anode layer 210, hole transport layer 211, and light-emitting layer 212 in embodiment 3. Also, the transistors T1 to T4 in embodiment 1 correspond respectively to the transistors T11 to T14 in embodiment 3, and the contact holes h1 to h3 in embodiment 1 correspond respectively to the contact holes h11 to h13 in embodiment 3.

Below, features of the wiring pattern in this embodiment are explained.

Holding Capacitor Under the Power Supply Line

In embodiment 1, the holding capacitor C was positioned between the power supply line Vdd and the data line Idata, outside the light-emitting portion (in the upper portion of the light-emitting portion in FIG. 2). However, when the area of the pixel region is comparatively small as in this embodiment, that is, when the pixel density is high, it is not possible to secure sufficient element space for occupation by the holding capacitor.

Hence in this embodiment, the holding capacitor C is formed in the region in which at least one among a first metal layer (for example, the source metal layer 206) or a second layer forms a power supply wiring pattern. Specifically, as shown in FIG. 10, the holding capacitor C is formed by stacking a gate metal layer 204 in parallel below the power supply line Vdd (source metal layer 206) positioned on the side of the light-emitting portion OLED.

The holding capacitor C is formed by causing an overlapping region to occur among the plurality of layers (for example, the source metal layer 206, gate metal layer 204, and semiconductor layer 202) relating to formation of the holding capacitor C, similarly to the holding capacitor explained in embodiment 1; near the overlapping region in which the holding capacitor C is formed, the region occupied by the layer positioned on the lower side among the plurality of layers is formed to be larger than the region occupied by layers positioned on the upper side. Specifically, as shown in FIG. 11B, if the width of the source metal layer 206 is d11, the width of the gate metal layer 204 is d12, and the width of the semiconductor layer 202 is d13, then the relation $d13>d12>d11$ obtains. The lower the layer, the larger the pattern shape is made.

The extent to which the size is increased will depend on the precision of the manufacturing processes and the pattern density. As one approach, patterns should be formed for each layer such that, when forming layers positioned on the upper side, even when the maximum possible shift in position occurs, the region in the layer positioned on the upper side will be contained within the region in the layer positioned on the lower side. In this embodiment also, the differences $d13-d12$ and $d12-d11$ are designed to be equal to or greater than predicted position shifts in manufacturing processes.

Holding Capacitor Below the Bank Layer

It is preferable that the above-described holding capacitor be formed below the bank layer 208, in order to isolate the above-described neighboring light-emitting portion. That is, because the bank layer is necessary for pixel separation, by superposing the wiring region for the power supply line and the overlapping region for the holding capacitor, the area occupied by the peripheral circuit can be greatly reduced, and a sufficient aperture ratio can be secured.

Reduction of Peripheral Circuit Space

Similarly to embodiment 1, in embodiment 2 a wiring pattern is fabricated such that at least one active element among a plurality of transistors and other active elements is connected to another active element by the same contact hole. Specifically, as shown in FIG. 10, the transistors T12, T13 and T14 are interconnected by the same contact hole h13. In this way, by designing the circuit such that there are numerous common contact points in the circuit, and arranging elements such that portions which are common contact points are connected by the same connection points, the number of contact holes can be reduced, and the occupied area of the peripheral circuit used for contact holes can be decreased.

Other features, such as for example the planar shape of the light-emitting portion, separation from the electrodes of the gate metal layer, peripheral circuit operation, and improvement of the current maintenance performance of the peripheral circuit, are similar to those of embodiment 1, and an explanation is omitted.

Embodiment 4

Figure 12:
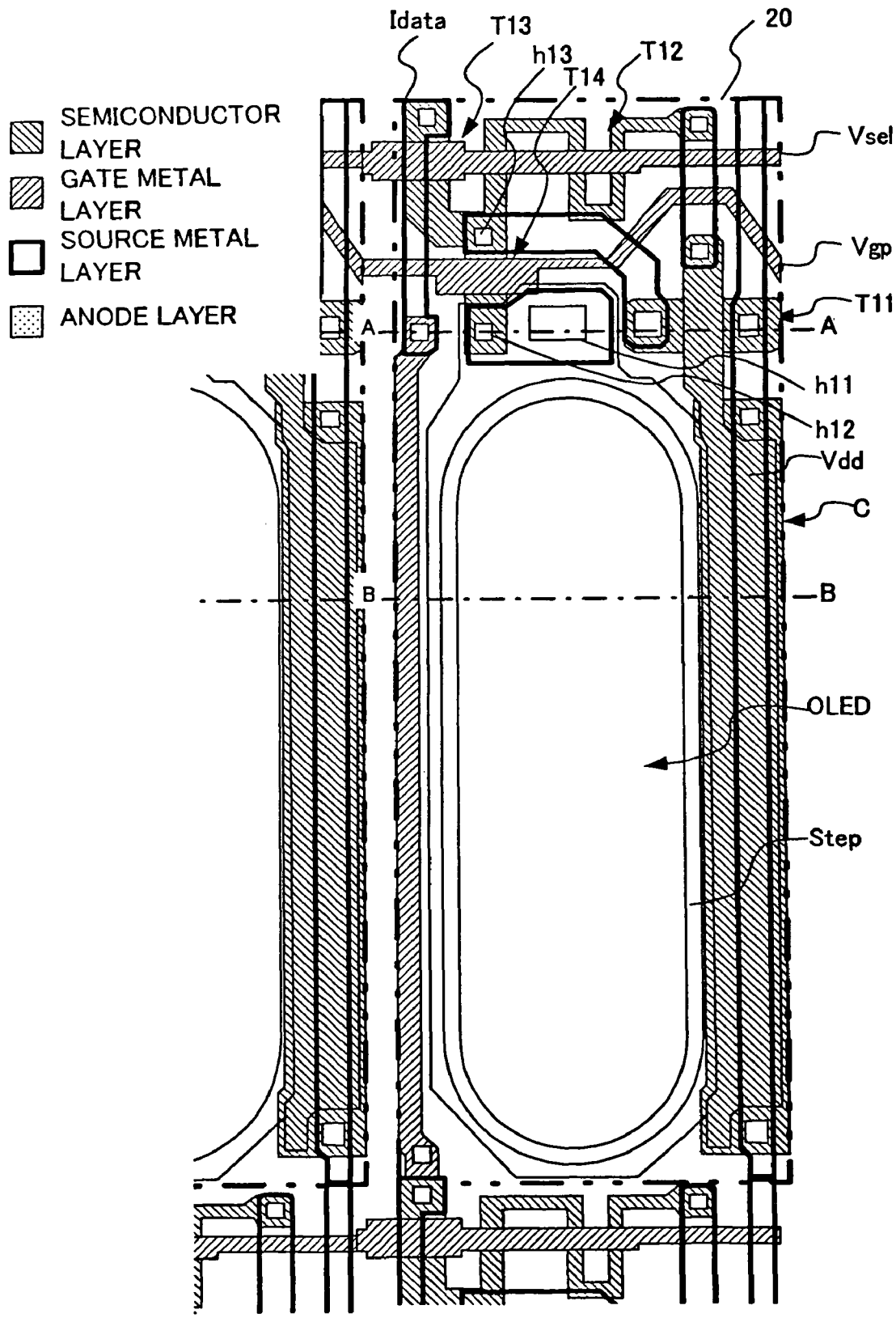
FIG. 12 is a plane view of a pixel region in embodiment 4.
Figure 13A:
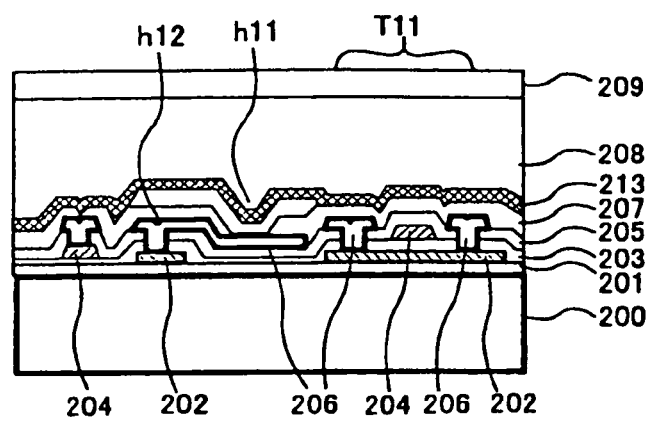
FIG. 13A is a cross-section along A-A in FIG. 12.
Figure 13B:
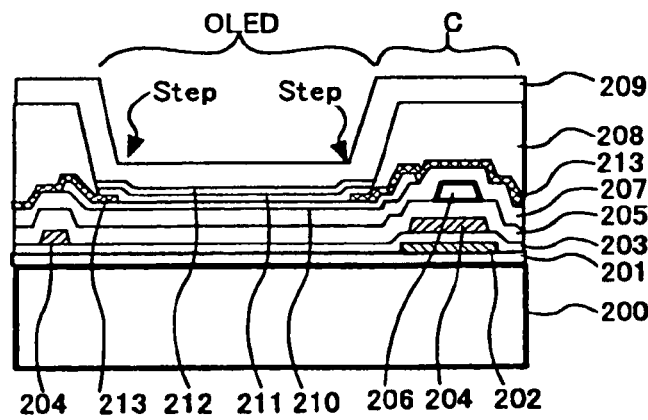
FIG. 13B is a cross-section along B-B in FIG. 12.

FIG. 12 shows a plane view which explains one pixel region and the peripheral wiring pattern for an EL element in embodiment 3 of this invention. FIG. 13 shows cross-sectional views which explain the layer structure at cross-sections indicated in FIG. 12. FIG. 13A and FIG. 13B show the layer structure at cross-sections A-A and B-B respectively in FIG. 12. As in embodiment 3, in these drawings the patterns of the principal semiconductor layer 202, gate metal layer 204, source metal layer 206, and anode layer 210 can be seen.

Except for the existence of an affinity-controlling film 213 forming a step shape, the configuration of the EL element of embodiment 4 is the same as the EL element of embodiment 3. Hence the same symbols in drawings are assigned to components which are the same as in embodiment 3, and an explanation is omitted.

Features of this embodiment are explained below.

Affinity-Controlling Layer

As shown in FIG. 13B, the light-emitting portion OLED in embodiment 4 comprises an affinity-controlling layer 213 between the second interlaminar insulating film 207 and the bank layer 208. This affinity-controlling layer 213 need not be formed over the entire pixel region, but must be provided, at least, near the boundaries of the light-emitting portion. The affinity-controlling layer 213 must have affinity with the liquid material used in forming the light-emitting portion. In this embodiment, the bank layer 208 forms walls near the boundaries of the light-emitting portion; a material which exhibits a lack of affinity with the liquid material used when forming the light-emitting layer 212 or hole injection layer 211 is selected, and is stacked on top of the affinity-controlling layer 213. Consequently the affinity-controlling layer 213 forms a step shape on the inside of the light-emitting portion with respect to the wall formed by the bank layer, as shown in FIG. 12 and FIG. 13B.

The material of the affinity-controlling layer 113 is determined according to the properties of the liquid material with which the light-emitting region is filled using the ink jet method. For example, if the liquid material comprises a liquid such as water which is highly polar, it is desirable that the affinity-controlling layer have polar bases, at least in the portion making contact with the liquid material or on the surface. Conversely, if the liquid material comprises a nonpolar liquid, it is desirable that the affinity-controlling layer have nonpolar bases, at least in the portion making contact with the liquid material or on the surface. Also, the extent of the affinity of the affinity-controlling layer is determined by the surface tension of the liquid material which fills the light-emitting region.

For example, even if a material which chemically has a weak affinity for water is used as an affinity-controlling layer, if the liquid material comprises large quantities of a solvent with a surface tension lower than that of water, the surface tension of the liquid material will be lower than that of water, and so the affinity-controlling layer will exhibit affinity for the liquid. Hence the type of material to use in the affinity-controlling layer is changed variously according to the liquid material to be used.

It is preferable that the affinity-controlling layer 213 comprise an inorganic compound or organic compound which in turn comprises one among Al, Ta or another metal, silicon oxide, silicon nitride, amorphous silicon, polysilicon, polyimide, an organic compound with fluoride bonds, or a photoresist. If insulating properties are necessary, the affinity-controlling layer comprises a nonmetallic compound. The affinity of these materials is determined by differences in the contact angle with respect to the liquid material. That is, the degree of affinity or absence of affinity is determined in relative and not absolute terms. The degree of affinity can also be adjusted through surface treatment methods.

It is preferable that the bank layer 108 comprise a material with weaker affinity than the affinity-controlling layer 113. This is because, by making the affinity of the bank layer weaker than that of the affinity-controlling layer, the absence of affinity of the bank layer can repel the liquid material to prevent flowing of the liquid material into neighboring pixel regions and avoid short-circuits. Also, the absence of affinity of the bank layer prevents liquid material from being drawn excessively toward the bank layer side so that a concave-shape film is formed.

Thus in this embodiment, an affinity-controlling layer with an affinity for the liquid material is provided near the boundaries of the light-emitting portion, so that the uniformity of the thickness of the hole injection layer, light-emitting layer, and other layers constituting the light-emitting portion can be improved.

According to this embodiment, a bank layer forming a wall near the boundaries of the light-emitting portion exhibits a lack of affinity with the liquid material, so that short-circuits with the neighboring pixel regions can be prevented.

In this embodiment, the affinity-controlling layer 213 is formed in a step shape; but when the thickness of the layer cross-section can be made sufficiently great, walls without a step shape, that is, a single wall without a step with the bank layer, may be formed.

Other advantageous results of embodiment 4 are similar to those of embodiment 1, and an explanation is omitted.

Embodiment 5

This embodiment relates to a display panel which is an electro-optical device having EL elements which are electro-optical elements explained in the above embodiments, and electronic device comprising such a display panel.

Figure 14:
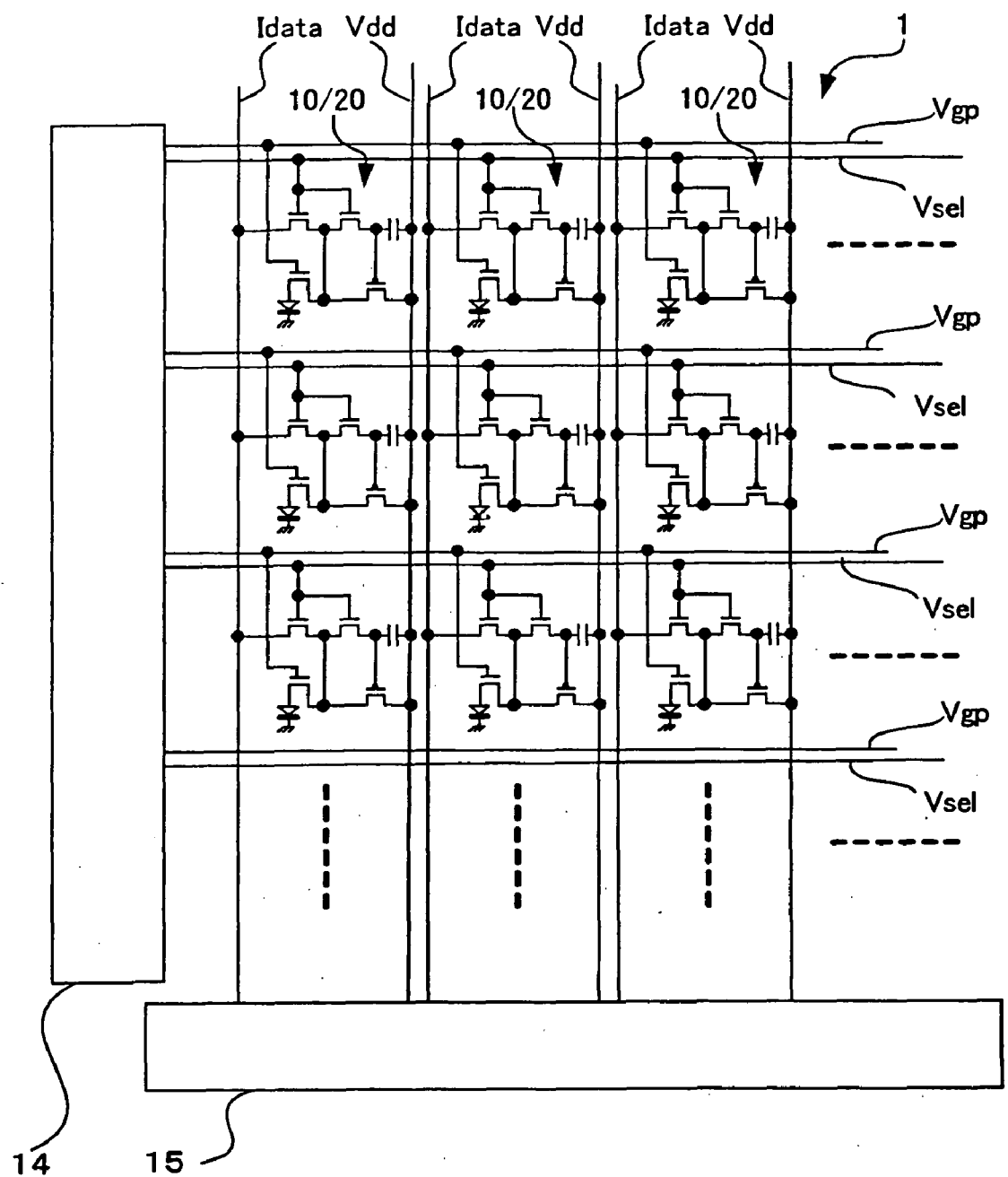
FIG. 14 is a connection diagram for a display panel in embodiment 5.

FIG. 14 shows a connection diagram for a display panel 1 of this embodiment. As indicated in FIG. 1, in display panel 1, pixel regions are arranged in the display region 11. As pixel regions, the pixel regions 10 of embodiment 1 or embodiment 2, or the pixel regions 20 of embodiments 3 or 4 may be employed. Control signals are supplied to each pixel region from the driver region 14, via the light-emission control lines Vgp and write-control lines Vsel. Data signals and a power supply voltage are supplied to each pixel region from the driver region 15, via data lines Idata and power supply lines Vdd.

The display panel 1 of this embodiment can be employed in various electronic device. FIG. 15 shows examples of electronic device which can employ the display panel 1.

Figure 15A:
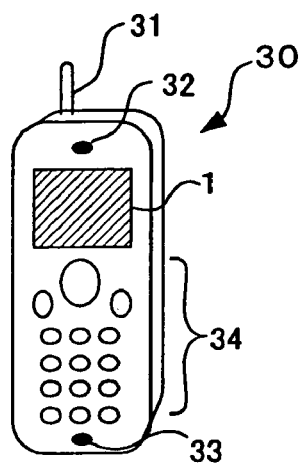
FIG. 15 shows examples of electronic device in embodiment 5, showing examples of application of a display panel of this invention to a portable telephone in FIG. 15A, to a camcorder in FIG. 15B, to a portable personal computer in FIG. 15C, to a head-mounted display in FIG. 15D, to a rear projector in FIG. 15E, and to a front projector in FIG. 15F.

FIG. 15A is an example of application to a portable telephone set; the portable telephone 30 comprises an antenna portion 31, voice output portion 32, voice input portion 33, operation portion 34, and a display panel 1 of this invention. Thus a display panel of this invention can be utilized as the display portion.

Figure 15B:
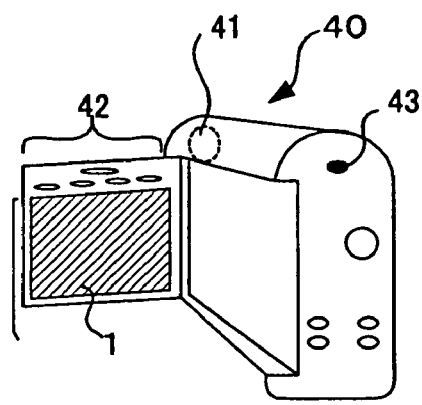

FIG. 15B is an example of application to a camcorder; the camcorder 40 comprises an imaging portion 41, operation portion 42, audio input portion 43, and a display panel 1 of this invention. Thus a display panel of this invention can be utilized as a viewfinder or display portion.

Figure 15C:
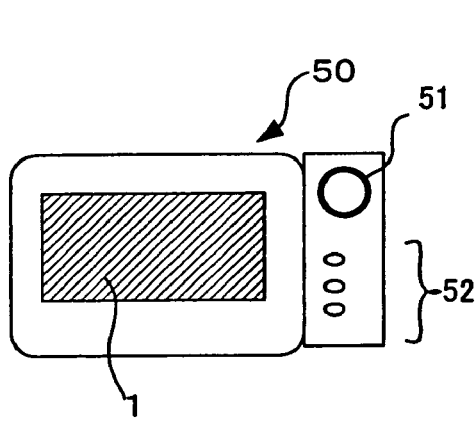

FIG. 15C is an example of application to a portable personal computer; the computer 50 comprises a camera portion 51, operation portion 52, and a display panel 1 of this invention. Thus a display panel of this invention can be utilized as a display portion.

Figure 15D:
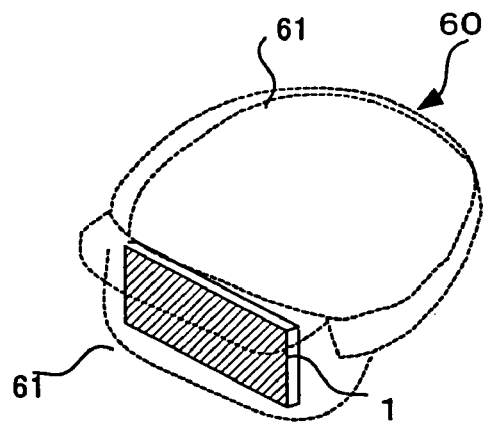

FIG. 15D is an example of application to a head-mounted display; the head-mounted display 60 comprises a band 61, optical system housing portion 62, and a display panel 1 of this invention. Thus a display panel of this invention can be utilized as an image display source.

Figure 15E:
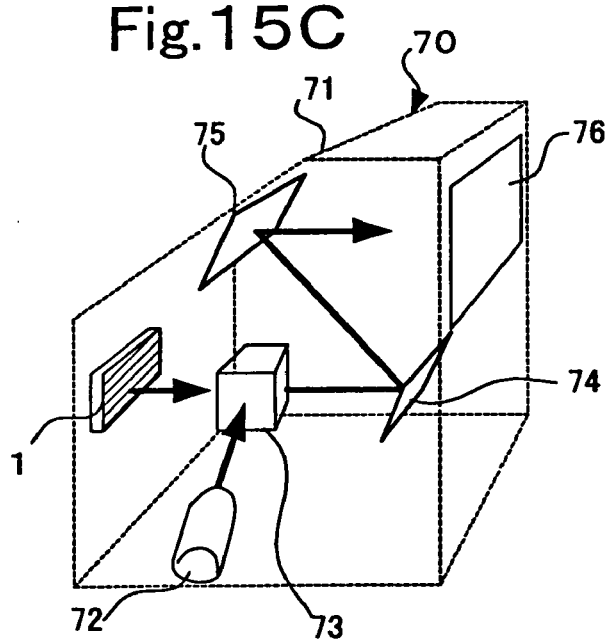

FIG. 15E is an example of application to a rear projector; the projector 70 comprises a housing 71, light source 72, synthetic optical system 73, mirror 74, mirror 75, screen 76, and a display panel 1 of this invention. Thus a display panel of this invention can be utilized as an image display source.

Figure 15F:
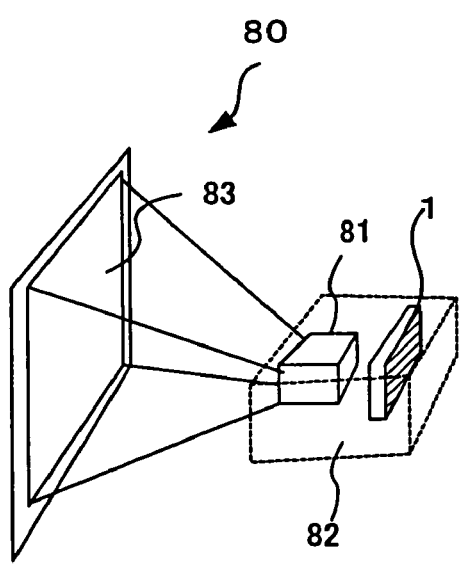

FIG. 15F is an example of application to a front projector; the projector 80 comprises a housing 82, optical system 81, and a display panel 1 of this invention, and is capable of displaying images on a screen 83. Thus a display panel of this invention can be utilized as an image display source.

Electro-optical devices of this invention are not limited to the above examples, but extend to all electronic device to which active-matrix type display devices can be applied. For example, in addition to the above, utilization in fax machines with display functions, in the viewfinders of digital cameras, in portable TV sets, in DSP devices, in PDAs, in electronic organizers, in electro-optical bulletin boards, in displays for advertising and announcements, and in other areas is possible.

FIG. 1
13 CATHODE LEAD ELECTRODE
12 CATHODE
1 DISPLAY PANEL
10 PIXEL REGION
11 DISPLAY REGION
14 DRIVER REGION
15 DRIVER REGION
16 GLASS SUBSTRATE
  FIG. 2
SEMICONDUCTOR LAYER
GATE METAL LAYER
SOURCE METAL LAYER
ANODE LAYER
  FIG. 8
SEMICONDUCTOR LAYER
GATE METAL LAYER
SOURCE METAL LAYER
ANODE LAYER
  FIG. 10
SEMICONDUCTOR LAYER
GATE METAL LAYER
SOURCE METAL LAYER
ANODE LAYER
  FIG. 12
SEMICONDUCTOR LAYER
GATE METAL LAYER
SOURCE METAL LAYER
ANODE LAYER

What is claimed is:

1. An electro-optical device, comprising:
   an electro-optical element;
   a holding capacitor that includes a plurality of layers including electrodes, the holding capacitor regulating a current supplied to the electro-optical element;
   a first transistor that supplies the current to the electro-optical element according to an electric charge amount held in the holding capacitor, the first transistor having a first gate electrode, a first source region and a first drain region;
   a second transistor connected between (i) the first gate electrode and (ii) the first source region or the first drain region, the second transistor having a second gate electrode;
   a wiring coupled between the first gate electrode and the second transistor;
   a control line that supplies a control signal to the second gate electrode, the control line being disposed to cross the wiring;
   a first metal layer that forms a supply line, the supply line supplying the current to the electro-optical element;
   a second metal layer that forms the first gate electrode;
   a semiconductor layer that has a first portion, the first portion of the semiconductor layer forming the first source region and the first drain region;
   a first interlaminar insulating film disposed between the first metal layer and the second metal layer; and
   a gate insulating film disposed between the second metal layer and the semiconductor layer,
   the holding capacitor having a first layer, a second layer, and a third layer, the first layer being formed by a portion of the first metal layer, the second layer being formed by a portion of the second metal layer, and the third layer being formed by a second portion of the semiconductor layer, the second portion of the semiconductor layer being physically isolated from the first portion of the semiconductor layer,
   the first layer being connected to the supply line and forming a first electrode of the holding capacitor, the second layer being connected to the control terminal of the active element and forming a second electrode of the holding capacitor,
   the third layer being electrically connected to the first layer via a contact hole so as to form the first electrode of the holding capacitor together with the first layer, and
   a first width of the first layer positioned on the second layer being formed to be smaller than a second width of the second layer, and the second width of the second layer positioned on the third layer being formed to be smaller than a third width of the third layer.

2. The electro-optical device according to claim 1, wherein the first layer is a portion of the supply line, and a portion of the second layer forming the second electrode of the holding capacitor is provided underneath the portion of the supply line forming the first layer and patterned to form the second electrode.

3. An electric apparatus comprising the electro-optical device according to claim 1.

4. An electro-optical device, according to claim 1, further comprising:
   a first difference between the first width and the second width being designed to be equal to or greater than predicted position shifts between the first layer and the second layer in their manufacturing processes, and
   a second difference between the second width and the third width being designed to be equal to or greater than predicted position shifts between the second layer and the third layer in their manufacturing processes.

* * * * *